United States Patent
Hsu et al.

(10) Patent No.: US 10,784,206 B2
(45) Date of Patent: Sep. 22, 2020

(54) SEMICONDUCTOR PACKAGE

(71) Applicant: MEDIATEK Inc., Hsinchu (TW)

(72) Inventors: Wen-Sung Hsu, Hsinchu (TW); Tao Cheng, Hsinchu (TW); Nan-Cheng Chen, Hsinchu (TW); Che-Ya Chou, Hsinchu (TW); Wen-Chou Wu, Hsinchu (TW); Yen-Ju Lu, Hsinchu (TW); Chih-Ming Hung, San Jose, CA (US); Wei-Hsiu Hsu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 16/163,614

(22) Filed: Oct. 18, 2018

(65) Prior Publication Data
US 2019/0051609 A1    Feb. 14, 2019

Related U.S. Application Data

(63) Continuation-in-part of application No. 15/672,440, filed on Aug. 9, 2017, now Pat. No. 10,186,488.
(Continued)

(51) Int. Cl.
*H01L 23/538* (2006.01)
*H01L 21/683* (2006.01)
(Continued)

(52) U.S. Cl.
CPC ........ *H01L 23/5389* (2013.01); *H01L 21/486* (2013.01); *H01L 21/4846* (2013.01);
(Continued)

(58) Field of Classification Search
CPC ............ H01L 23/5389; H01L 23/5383; H01L 23/49811; H01L 21/486; H01L 2221/6835;
(Continued)

(56) References Cited

U.S. PATENT DOCUMENTS 8,445,323 B2    5/2013    Lin et al.
9,034,694 B1    5/2015    Kalandar et al.
(Continued)

FOREIGN PATENT DOCUMENTS

CN    103943600 A    7/2014
EP    3091571 A2    11/2016
(Continued)

OTHER PUBLICATIONS

CN Office Action dated Aug. 20, 2018 in Chinese application (No. 201610614954.0).
(Continued)

*Primary Examiner* — Sonya McCall-Shepard
(74) *Attorney, Agent, or Firm* — McClure, Qualey & Rodack, LLP

(57) ABSTRACT

A semiconductor package includes a first substrate, a first layer structure, a second layer structure and a first antenna layer. The first antenna layer is formed on at least one of the first layer structure and the second layer structure. The first layer structure is formed between the first substrate and the second layer structure.

17 Claims, 22 Drawing Sheets

Related U.S. Application Data which is a continuation of application No. 15/162,760, filed on May 24, 2016, now Pat. No. 9,761,534.

(60) Provisional application No. 62/221,262, filed on Sep. 21, 2015, provisional application No. 62/587,624, filed on Nov. 17, 2017.

(51) Int. Cl.
| | |
|---|---|
| *H01Q 9/04* | (2006.01) |
| *H01L 23/498* | (2006.01) |
| *H01Q 1/22* | (2006.01) |
| *H01L 23/31* | (2006.01) |
| *H01L 25/10* | (2006.01) |
| *H01L 23/50* | (2006.01) |
| *H01Q 21/06* | (2006.01) |
| *H01L 23/00* | (2006.01) |
| *H01L 21/48* | (2006.01) |
| *H01L 21/56* | (2006.01) |
| *H01L 25/00* | (2006.01) |
| *H01L 25/065* | (2006.01) |
| *H01L 25/16* | (2006.01) |
| *H01L 23/66* | (2006.01) |
| *H01L 23/14* | (2006.01) |

(52) U.S. Cl.
CPC ........ *H01L 21/4853* (2013.01); *H01L 21/565* (2013.01); *H01L 21/568* (2013.01); *H01L 21/6835* (2013.01); *H01L 23/3114* (2013.01); *H01L 23/3128* (2013.01); *H01L 23/49811* (2013.01); *H01L 23/49827* (2013.01); *H01L 23/50* (2013.01); *H01L 23/5383* (2013.01); *H01L 23/66* (2013.01); *H01L 25/0657* (2013.01); *H01L 25/10* (2013.01); *H01L 25/105* (2013.01); *H01L 25/16* (2013.01); *H01L 25/162* (2013.01); *H01L 25/165* (2013.01); *H01L 25/50* (2013.01); *H01Q 1/2283* (2013.01); *H01Q 9/0407* (2013.01); *H01Q 9/0414* (2013.01); *H01L 23/145* (2013.01); *H01L 23/49816* (2013.01); *H01L 24/13* (2013.01); *H01L 24/16* (2013.01); *H01L 24/48* (2013.01); *H01L 24/81* (2013.01); *H01L 2221/68345* (2013.01); *H01L 2221/68359* (2013.01); *H01L 2223/6677* (2013.01); *H01L 2224/131* (2013.01); *H01L 2224/13101* (2013.01); *H01L 2224/16225* (2013.01); *H01L 2224/16227* (2013.01); *H01L 2224/16238* (2013.01); *H01L 2224/45099* (2013.01); *H01L 2224/48227* (2013.01); *H01L 2224/81005* (2013.01); *H01L 2225/1023* (2013.01); *H01L 2225/1041* (2013.01); *H01L 2225/1058* (2013.01); *H01L 2924/00014* (2013.01); *H01L 2924/014* (2013.01); *H01L 2924/1533* (2013.01); *H01L 2924/1579* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19106* (2013.01); *H01Q 21/065* (2013.01)

(58) Field of Classification Search
CPC . H01L 2224/13101; H01L 2224/16225; H01L 2924/181; H01L 24/48; H01L 2224/16227; H01L 2224/16238; H01L 2224/81005; H01L 2924/15311; H01L 2924/19041; H01L 2924/19042; H01L 2924/19043; H01L 2924/19106; H01L 24/13; H01L 24/16; H01L 24/81; H01Q 9/0407; H01Q 9/0414; H01Q 1/2283; H01Q 21/065
See application file for complete search history.

(56) References Cited

U.S. PATENT DOCUMENTS

| | | |
|---|---|---|
| 9,171,797 B2 | 10/2015 | Lin et al. |
| 9,761,534 B2 | 9/2017 | Hsu et al. |
| 2008/0237805 A1* | 10/2008 | Ohnuma ............ H01L 23/3135 257/618 |
| 2009/0267221 A1 | 10/2009 | Fuji |
| 2010/0314741 A1 | 12/2010 | Lee et al. |
| 2011/0140259 A1 | 6/2011 | Cho et al. |
| 2012/0056321 A1 | 3/2012 | Pagaila |
| 2012/0061814 A1 | 3/2012 | Camacho et al. |
| 2012/0280366 A1* | 11/2012 | Kamgaing ............ H01L 23/552 257/621 |
| 2013/0078915 A1 | 3/2013 | Zhao et al. |
| 2014/0035097 A1 | 2/2014 | Lin et al. |
| 2014/0227832 A1 | 8/2014 | Wang et al. |
| 2014/0252646 A1 | 9/2014 | Hung et al. |
| 2015/0044819 A1 | 2/2015 | Lin et al. |
| 2015/0325925 A1 | 11/2015 | Kamgaing et al. |
| 2016/0027764 A1 | 1/2016 | Kim et al. |
| 2016/0172334 A1 | 6/2016 | Hsu et al. |
| 2016/0329299 A1 | 11/2016 | Lin et al. |

FOREIGN PATENT DOCUMENTS

| | | |
|---|---|---|
| EP | 3147942 A1 | 3/2017 |
| TW | 201532209 A | 8/2015 |
| TW | 201712813 A | 4/2017 |
| WO | 2017111768 A1 | 6/2017 |

OTHER PUBLICATIONS

TIPO Office Action dated Jan. 23, 2017 in Taiwan application (No. 105120336).
EPO Search Report dated Feb. 24, 2017 in European application (No. 16175721.6-1552).
TIPO Office Action dated Mar. 30, 2017 in Taiwan application (No. 105120336).
EPO Search Report dated Mar. 20, 2019 in EP application (No. 18205196.1-1211).
TIPO Office Action dated May 10, 2019, Taiwan Application# 107140783, pp. 1-5.
CN Office Action dated Apr. 29, 2020 in Chinese application (No. 201811366052.5).

* cited by examiner

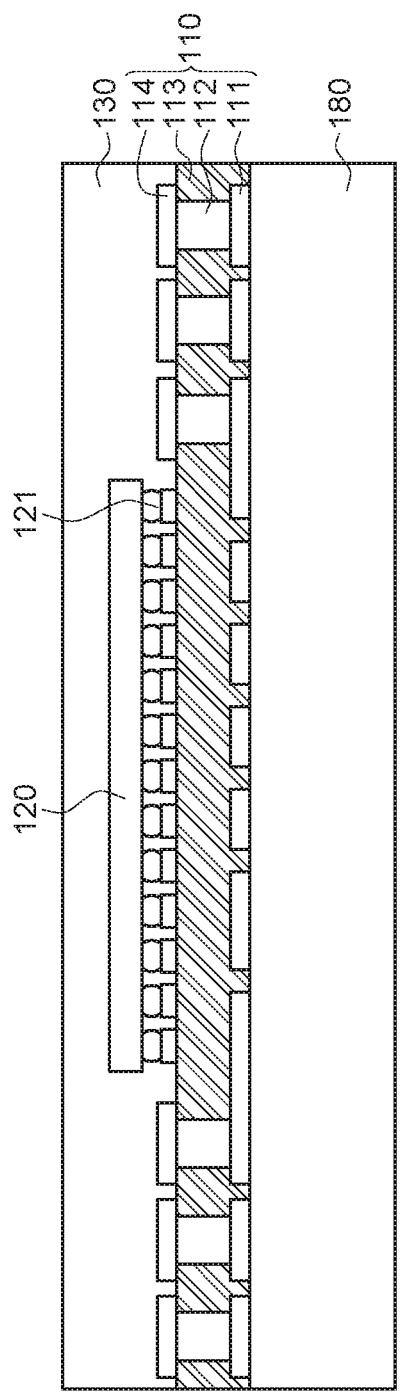
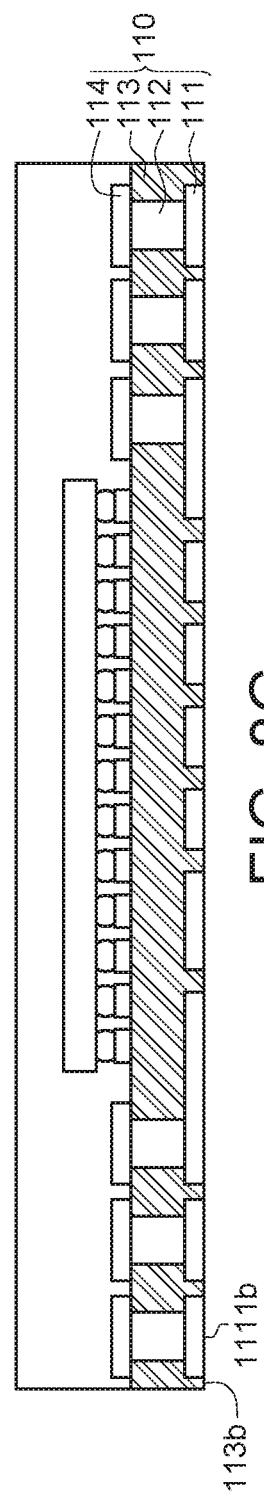

US 10,784,206 B2

SEMICONDUCTOR PACKAGE

This application is a Continuation-In-Part of U.S. application Ser. No. 15/672,440, filed Aug. 9, 2017 which is a Continuation of U.S. application Ser. No. 15/162,760 (now patented as U.S. Pat. No. 9,761,534), filed May 24, 2016, which claims the benefit of U.S. provisional application Ser. No. 62/221,262, filed Sep. 21, 2015. This application also claims the benefit of U.S. provisional application Ser. No. 62/587,624, filed Nov. 17, 2017, the disclosure of which is incorporated by reference herein in its entirety.

FIELD OF THE INVENTION

The invention relates to a semiconductor package, and more particularly to a semiconductor package having antenna.

BACKGROUND OF THE INVENTION

In the electronics industry, high integration and multiple functions with high performance become essential for new products. And meanwhile, high integration may cause higher manufacturing cost, since the manufacturing cost is in proportional to its size. Therefore, demanding on miniaturization of integrated circuit (IC) packages has become more and more critical.

Package-on-package (PoP) is now the fastest growing semiconductor package technology since it is a cost-effective solution to high-density system integration in a single package. In a PoP structure, various packages are integrated in a single semiconductor package to reduce the size. Accordingly, there exists a need to provide a semiconductor package to overcomes, or at least reduces the above-mentioned problems.

Therefore, it is important to increase the performance of the 3D graphic processing circuit while reducing the consumption of the electric power and extending the operating time of the mobile device.

SUMMARY OF THE INVENTION

In one embodiment of the invention, a semiconductor package is provided. The semiconductor package includes a first substrate, a first layer structure, a second layer structure and a first antenna layer. The first antenna layer is formed on at least one of the first layer structure and the second layer structure. The first layer structure is formed between the first substrate and the second layer structure.

In another embodiment of the invention, a semiconductor package is provided. The semiconductor package includes a first substrate, a first layer structure, a second layer structure and a first antenna layer. The first layer structure includes a conductive pillar layer exposed from the first layer structure. The first antenna layer is formed on at least one of the first layer structure and the second layer structure. The first layer structure is formed between the first layer structure and the second layer structure.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which:

FIGS. 8A to 8H illustrate manufacturing processes of the semiconductor package of FIG. 1;

DETAILED DESCRIPTION OF PREFERRED EMBODIMENTS

Figure 1:
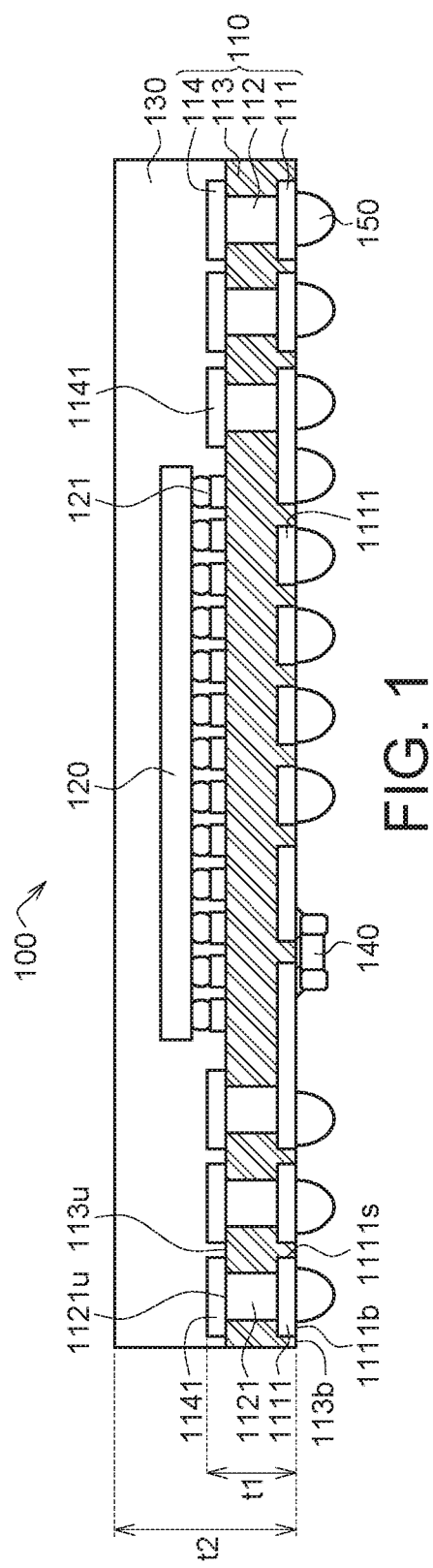
FIG. 1 illustrates a diagram of a semiconductor package according to an embodiment of the invention.

FIG. 1 illustrates a diagram of a semiconductor package 100 according to an embodiment of the invention. The semiconductor package 100 includes a package substrate 110, a first electronic component 120, a second package body 130, a second electronic component 140 and at least one conductive contact 150.

The package substrate 110 includes a first conductive layer 111, a first pillar layer 112, a first package body 113 and a second conductive layer 114.

The first conductive layer 111 includes a plurality of elements 1111, such as pads, traces or combination thereof. Each element 1111 has a first lower surface 1111$b$ and a first lateral surface 1111$s$, and the first package body 113 has a second lower surface 113$b$. The first lower surface 1111$b$ is exposed from the second lower surface 113$b$, and the first lower surface 1111$b$ is aligned with the second lower surface 113$b$. Each element 1111 may be a multi-layered structure or single-layered structure. For example, each element 1111 includes nickel layer, gold layer, palladium layer, copper layer or combination thereof.

The first pillar layer 112 connects the first conductive layer 111 to the second conductive layer 114. In the present embodiment, the first pillar layer 112 includes a plurality of pillars 1121. The pillars 1121 are made of a material such as copper. Each pillar 1121 has a first upper surface 1121u, and the first package body 113 has a second upper surface 113u, wherein the first upper surface 1121u is exposed from the second upper surface 113u and aligned with the second upper surface 113u.

The first package body 113 encapsulates the first conductive layer 111 and the first pillar layer 112. For example, the first package body 113 encapsulates the first lateral surface 1111s of the first conductive layer 111 and the lateral surface of each pillar 1121.

The first package body 113 may be a molding compound which is made of a material including, for example, a Novolac-based resin, an epoxy-based resin, a silicone-based resin, or another suitable encapsulant. Suitable fillers also can be included, such as powdered $SiO_2$.

Since the first package body 113 is the molding compound, the package substrate 110 has thin thickness t1. Compared to the silicon substrate, the thickness t1 of the package substrate 110 is much smaller. In general, the silicon substrate has a thickness larger than 100 micrometers. In the present embodiment, the thickness t1 of the package substrate 110 is smaller, and accordingly the thickness t2 of the semiconductor package 100 may be reduced.

The second conductive layer 114 includes a plurality of elements 1141, such as pads, traces or combination thereof. Each element 1141 may be a multi-layered structure or single-layered structure. For example, the element 1141 may be nickel layer, gold layer, copper layer, palladium layer or combination thereof.

In the present embodiment, the first electronic component 120 is coupled to the second conductive layer 114 of the package substrate 110 in a "face-down" orientation and electrically connected to the second conductive layer 114 via a plurality of conductive contacts 121. This configuration is sometimes referred to as "flip-chip". The conductive contact 121 may be solder ball, conductive pillar, etc.

In other embodiments, the first electronic component 120 may be coupled to the package substrate 110 in a "face-up" orientation, and electrically connected to the package substrate 110 via a plurality of conductive bond wires (not shown). The first electronic component 120 may be an active chip or a passive component, such as a resistor, an inductor or a capacitor. In another embodiment, the number of the first electronic component 120 may be several. In addition, the first electronic component 120 may be, for example, a chip, a passive component, etc.

The second package body 130 formed on the second upper surface 113u of the package substrate 110 encapsulates the second conductive layer 114 and the first electronic component 120. The second package body 130 may be made of a material which is the same as that of the first package body 113.

The second electronic component 140 is disposed on the first lower surface 1111b of the first substrate 110 and electrically connects to the first conductive layer 111. In one embodiment, the second electronic component 140 is, for example, passive component, such as a resistor, an inductor or a capacitor.

The conductive contacts 150 are disposed on the first lower surface 1111b of the first substrate 110. The semiconductor package 100 is disposed on and electrically connected to an exterior circuit, such as a circuit board, through the conductive contacts 150. The conductive contacts 150 may be solder ball, conductive pillar, etc.

Figure 2:
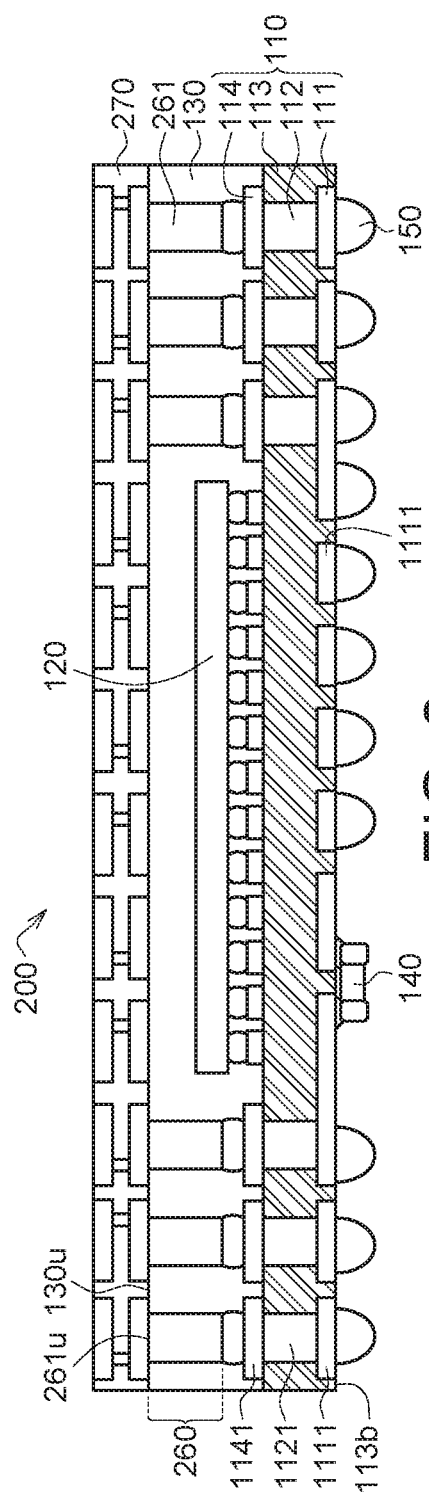
FIG. 2 illustrates a diagram of a semiconductor package according to another embodiment of the invention.

FIG. 2 illustrates a diagram of a semiconductor package 200 according to another embodiment of the invention. The semiconductor package 200 includes the package substrate 110, the first electronic component 120, the second package body 130, the second electronic component 140, at least one conductive contact 150, a second pillar layer 260 and an interposer 270.

The second package body 130 further encapsulates the second pillar layer 260. The second pillar layer 260 includes a plurality of pillars 261 connecting the second conductive layer 114 to the interposer 270.

The interposer 270 is disposed on the second package body 130 and electrically connects to the package substrate 110 through the second pillar layer 260 encapsulated within second package body 130. The interposer 270 may be electrically connected to the first electronic component 120 through the second pillar layer 260 and the package substrate 110.

Each pillar 261 has a third upper surface 261u, and the second package body 130 has a fourth upper surface 130u, wherein the third upper surface 261u is exposed from the fourth upper surface 130u and aligned with the fourth upper surface 130u.

Figure 3:
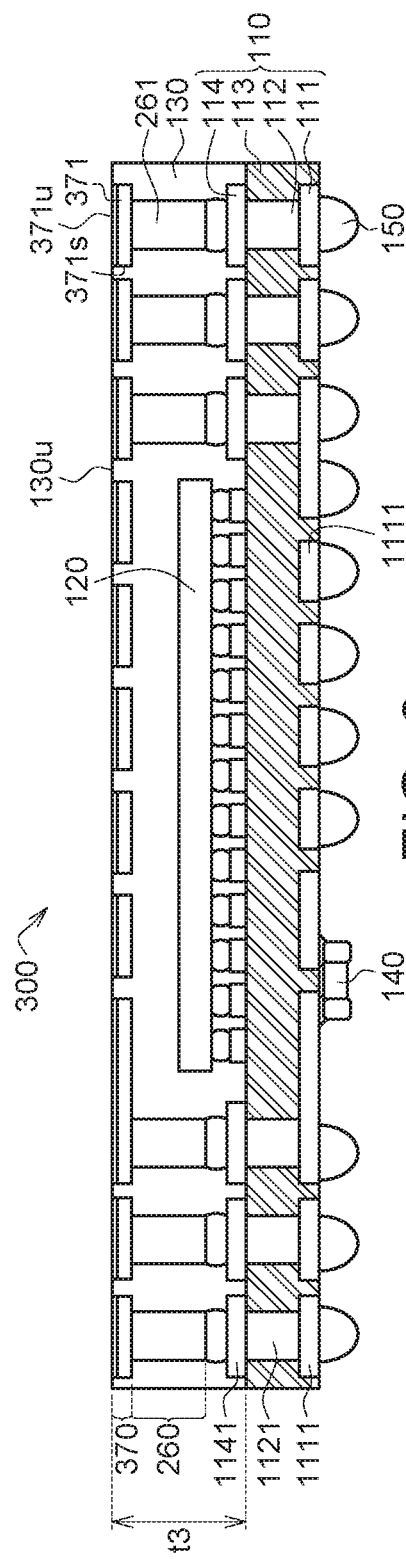
FIG. 3 illustrates a diagram of a semiconductor package according to another embodiment of the invention.

FIG. 3 illustrates a diagram of a semiconductor package 300 according to another embodiment of the invention. The semiconductor package 300 includes the package substrate 110, the first electronic component 120, the second package body 130, the second electronic component 140, at least one conductive contact 150, the second pillar layer 260 and a fourth conductive layer 370.

The second package body 130 encapsulates the second conductive layer 114, the second pillar layer 260 and the fourth conductive layer 370.

The second pillar layer 260 electrically connects the second conductive layer 114 to the fourth conductive layer 370, such that the first electronic component 120 may electrically connect the fourth conductive layer 370 through the package substrate 110 and the second pillar layer 260.

The fourth conductive layer 370 includes a plurality of elements 371, such as pads, traces or combination thereof. Each element 371 has a fifth upper surface 371u, and the second package body 130 has the fourth upper surface 130u, wherein the fifth upper surface 371u is exposed from the fourth upper surface 130u and aligned with the fourth upper surface 130u.

Each element 371 may be a multi-layered structure or single-layered structure. For example, the each element 371 includes nickel layer, gold layer, palladium layer, copper layer or combination thereof.

The fourth conductive layer 370 is embedded in the second package body 130. For example, each element 371 (trace or pad) has a second lateral surface 371s which is encapsulated by the second package body 130. Since the fourth conductive layer 370 is embedded in the second package body 130, the second package body 130 has a thin thickness t3.

Figure 4:
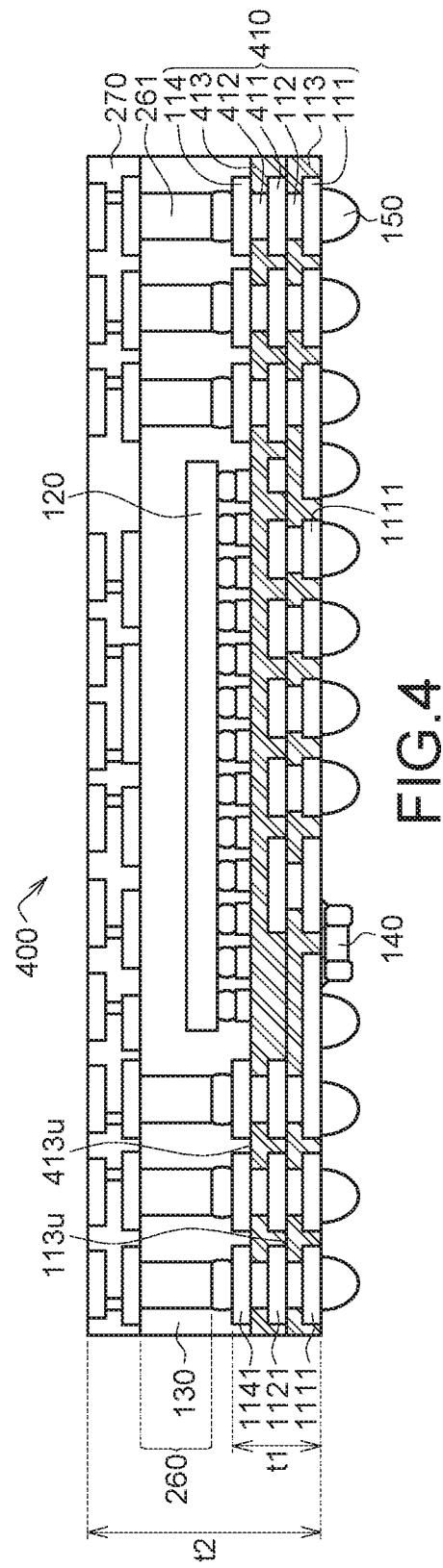
FIG. 4 illustrates a diagram of a semiconductor package according to another embodiment of the invention.

FIG. 4 illustrates a diagram of a semiconductor package 400 according to another embodiment of the invention. The semiconductor package 400 includes a package substrate 410, the first electronic component 120, the second package body 130, the second electronic component 140, at least one conductive contact 150, the second pillar layer 260 and the interposer 270.

In the present embodiment, the package substrate 410 is multi-layered package structure. For example, the package substrate 410 includes the first conductive layer 111, the first pillar layer 112, the first package body 113, the second conductive layer 114, a third conductive layer 411, a third pillar layer 412 and a third package body 413. The first conductive layer 111, the first pillar layer 112 and the first package body 113 together form a first single-layered package structure, and the third conductive layer 411, the third pillar layer 412 and the third package body 413 form a second single-layered package structure. In another embodiment, the number of the layers of the package substrate 410 may be more than two.

The third conductive layer 411 is formed on the second upper surface 113u of the first package body 113 and electrical connects to the first pillar layer 112. The third pillar layer 412 connects the third conductive layer 411 to the second conductive layer 114. The third package body 413 encapsulates the third pillar layer 412 and the third conductive layer 411. In the present embodiment, the second conductive layer 114 is formed on a sixth upper surface 413u of the third package body 413 and electrically connects to the first conductive layer 111 through the third conductive layer 411, the third pillar layer 412 and the first pillar layer 112.

In addition, the third package body 413 may be made of a material which is the same as that of the first package body 113.

Since the first package body 113 and the third package body 413 are the molding compounds, the package substrate 410 has thin thickness t1. Compared to the silicon substrate, the thickness t1 of the package substrate 410 is much smaller. In general, the silicon substrate has the thickness larger than 100 micrometers. In the present embodiment, the thickness t1 of the package substrate 410 is smaller, and accordingly the thickness t2 of the semiconductor package 100 may be reduced.

Figure 5:
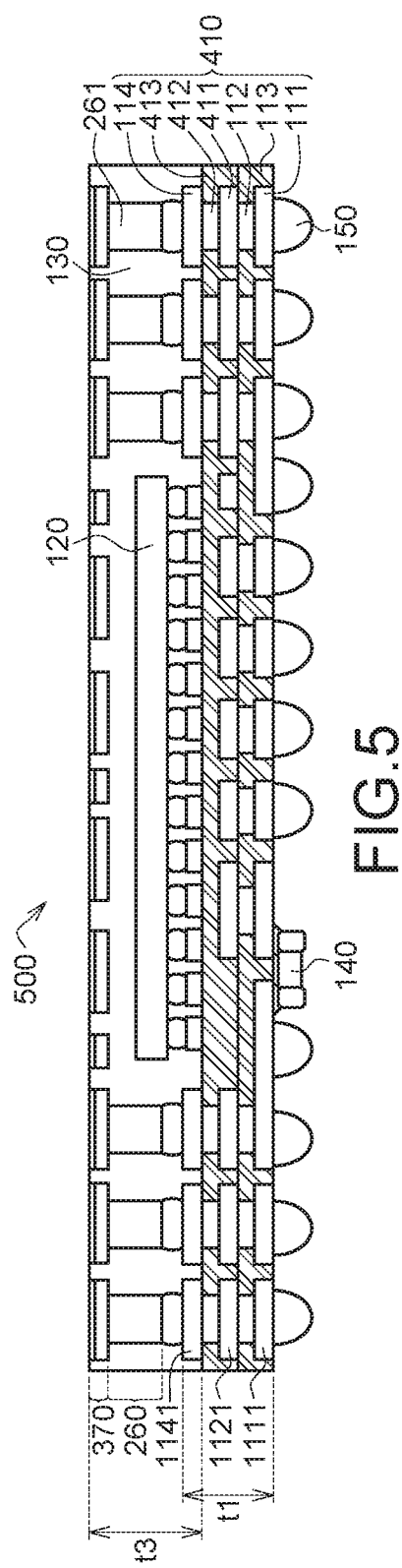
FIG. 5 illustrates a diagram of a semiconductor package according to another embodiment of the invention.

FIG. 5 illustrates a diagram of a semiconductor package 500 according to another embodiment of the invention. The semiconductor package 500 includes the package substrate 410, the first electronic component 120, the second package body 130, the second electronic component 140, at least one conductive contact 150, the second pillar layer 260 and the fourth conductive layer 370.

In the present embodiment, since the fourth conductive layer 370 is embedded in the second package body 130, the second package body 130 has the thin thickness t3. The second pillar layer 260 electrically connects the second conductive layer 114 to the fourth conductive layer 370, such that the first electronic component 120 may electrically connect the fourth conductive layer 370 through the package substrate 410 and the second pillar layer 260.

Figure 6:
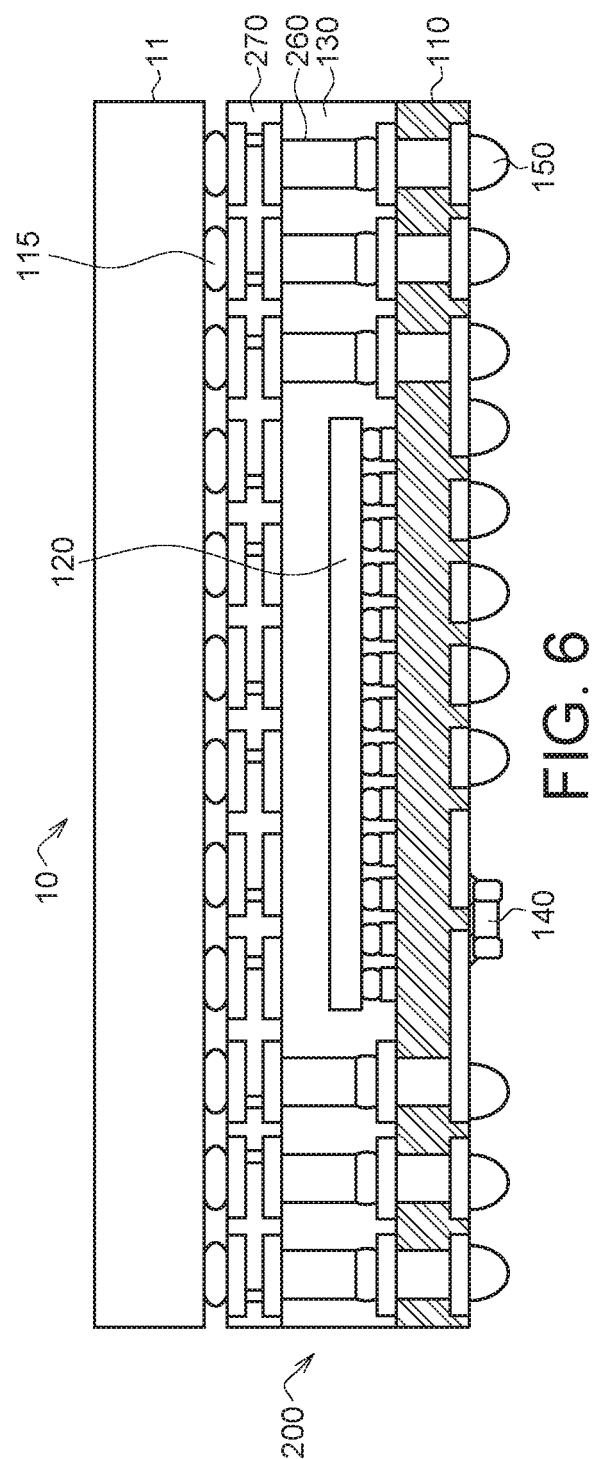
FIG. 6 illustrates a diagram of a semiconductor device according to one embodiment of the invention.

FIG. 6 illustrates a diagram of a semiconductor device 10 according to one embodiment of the invention. The semiconductor device 10 includes the semiconductor package 200 and a third electronic component 11. In another embodiment, the third electronic component 11 may be a semiconductor package including a plurality of dies, such as DRAMs stacked to each other.

The third electronic component 11 is disposed on the interposer 270 of the semiconductor package 200 in a "face-down" orientation and electrically connected to the interposer 270 via a plurality of conductive contacts 115. The conductive contacts 115 may be solder ball, conductive pillar, etc. In another embodiment, the third electronic component 11 is disposed on the interposer 270 in a "face-up" orientation and electrically connected to the interposer 270 via a plurality of conductive bond wires (not shown). The third electronic component 11 electrically connects to the first electronic component 120 through the interposer 270, the second pillar layer 260 and the package substrate 110. In addition, the third electronic component 11 electrically connects to the conductive contacts 150 through the interposer 270, the second pillar layer 260 and the package substrate 110.

Figure 7:
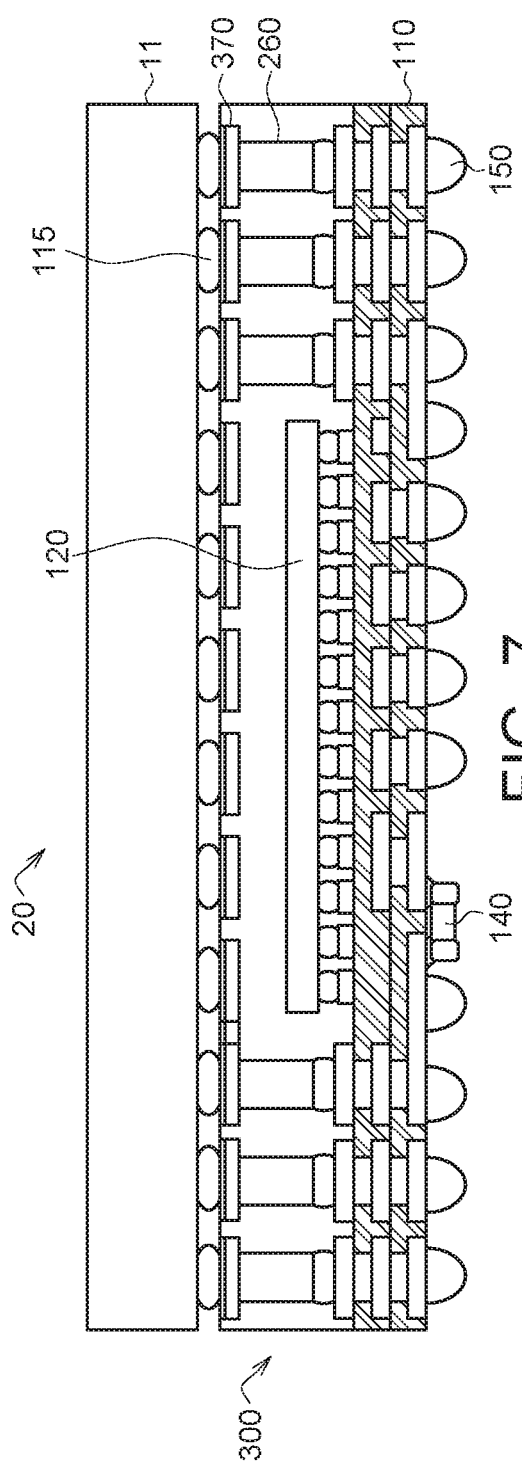
FIG. 7 illustrates a diagram of a semiconductor device according to another embodiment of the invention.

FIG. 7 illustrates a diagram of a semiconductor device 20 according to another embodiment of the invention. The semiconductor device 20 includes the semiconductor package 300 and a third electronic component 11.

The third electronic component 11 is disposed on the fourth conductive layer 370 of the semiconductor package 300 in a "face-down" orientation or in a "face-up" orientation. The third electronic component 11 electrically connects to the first electronic component 120 through the fourth conductive layer 370, the second pillar layer 260 and the package substrate 110. In addition, the third electronic component 11 electrically connects to the conductive contacts 150 through the fourth conductive layer 370, the second pillar layer 260 and the package substrate 110.

In another embodiment, the third electronic component 11 may be disposed on the interposer 270 of the semiconductor package 400 of FIG. 4 to form another semiconductor device. In other embodiment, the third electronic component 11 may be disposed on the fourth conductive layer 370 of the semiconductor package 500 of FIG. 5 to form another semiconductor device.

FIGS. 8A to 8H illustrate manufacturing processes of the semiconductor package 100 of FIG. 1.

Figure 8A:
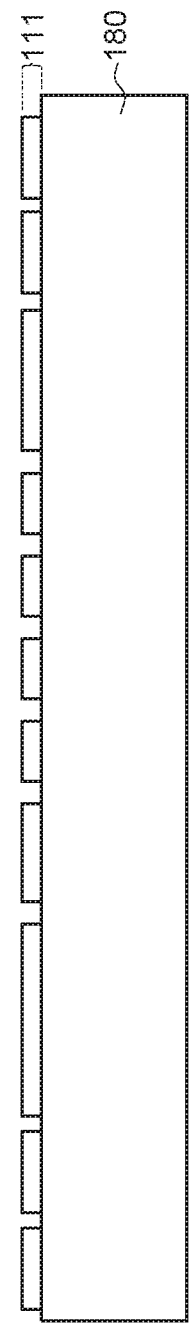

Referring to FIG. 8A, a carrier 180 is provided. The carrier 180 may be formed by a metal plate comprising of copper, iron or steel.

Referring to FIG. 8A, the first conductive layer 111 is formed on the carrier 180 using, for example, photolithography, electroless plating, electrolytic plating, printing, sputtering, vacuum deposition, etc.

Figure 8B:
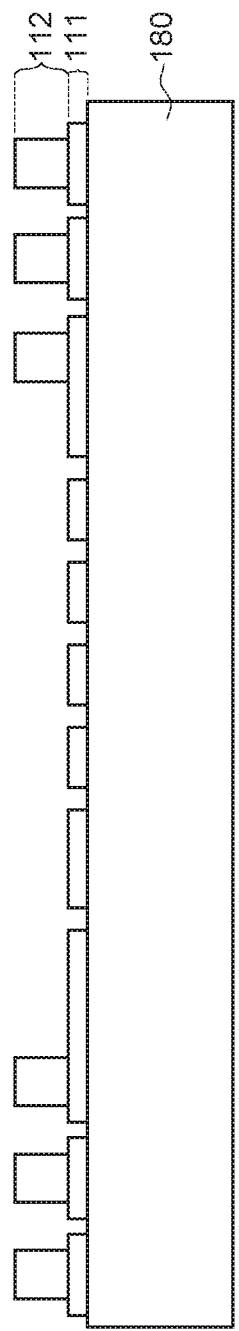

Referring to FIG. 8B, the first pillar layer 112 is formed on the first conductive layer 111 using, for example, photolithography, electroless plating, electrolytic plating, printing, sputtering, vacuum deposition, etc.

Figure 8C:
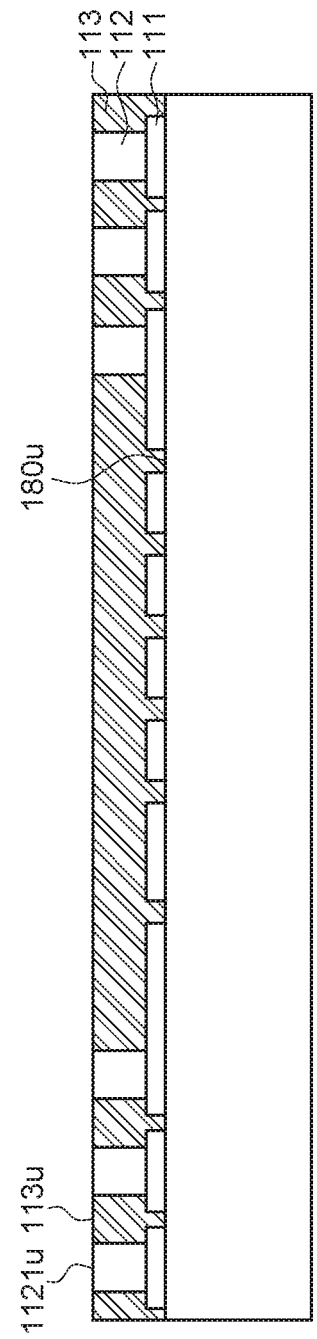

Referring to FIG. 8C, the first package body 113 encapsulating the first conductive layer 111 and the first pillar layer 112 is formed on an upper surface 180u of the carrier 180. The first package body 113 may be formed by various packaging technologies, such as, for example, compression molding, injection molding, transfer molding or dispensing technology.

In the present embodiment, the first package body 113 may be grinded, such that the first upper surface 1121u of each pillar 1121 is exposed from the second upper surface 113u of the first package body 113, wherein the first upper surface 1121u is aligned with the second upper surface 113u.

Figure 8D:
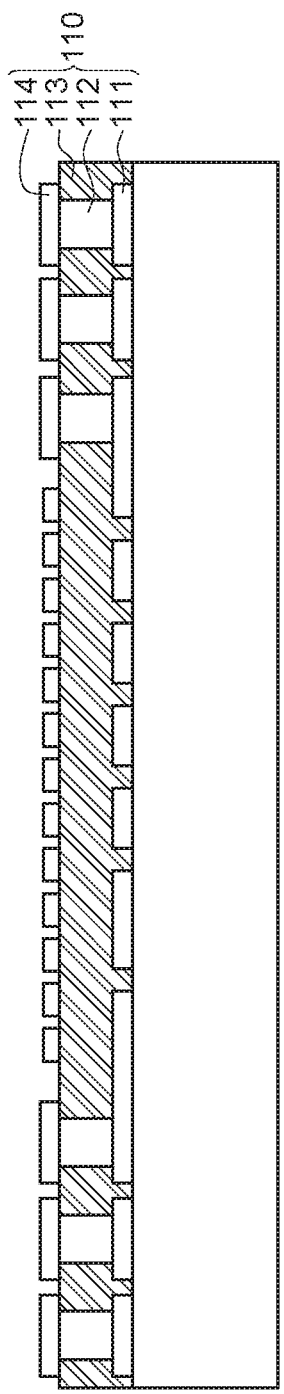

Referring to FIG. 8D, the second conductive layer 114 is formed on the first pillar layer 112 using, for example, photolithography, electroless plating, electrolytic plating, printing, sputtering, vacuum deposition, etc. The first conductive layer 111, the first pillar layer 112, the first package body 113 and the second conductive layer 114 form the package substrate 110.

Figure 8E:
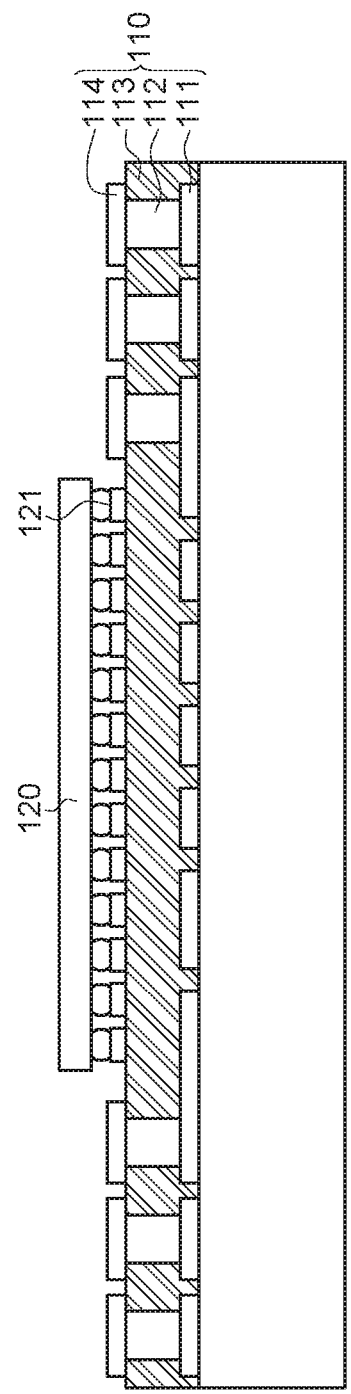

Referring to FIG. 8E, the first electronic component 120 is disposed on second conductive layer 114 of the package substrate 110 through the conductive contacts 121 using, for example, surface mount technology (SMT).

Referring to FIG. 8F, the second package body 130 encapsulating the first electronic component 120 and the second conductive layer 114 is formed on the package substrate 110. The second package body 130 may be formed by various packaging technologies, such as, for example, compression molding, injection molding, transfer molding or dispensing technology.

Referring to FIG. 8G, the carrier 180 is removed using, for example, etching, peeling, etc. After the carrier 180 is removed, the first lower surface 1111b of the first conductive layer 111 and the second lower surface 113b of the first package body 113 are exposed, wherein the first lower surface 1111b and the second lower surface 113b are aligned with each other. For example, the first lower surface 1111b and the second lower surface 113b are coplanar.

Figure 8H:
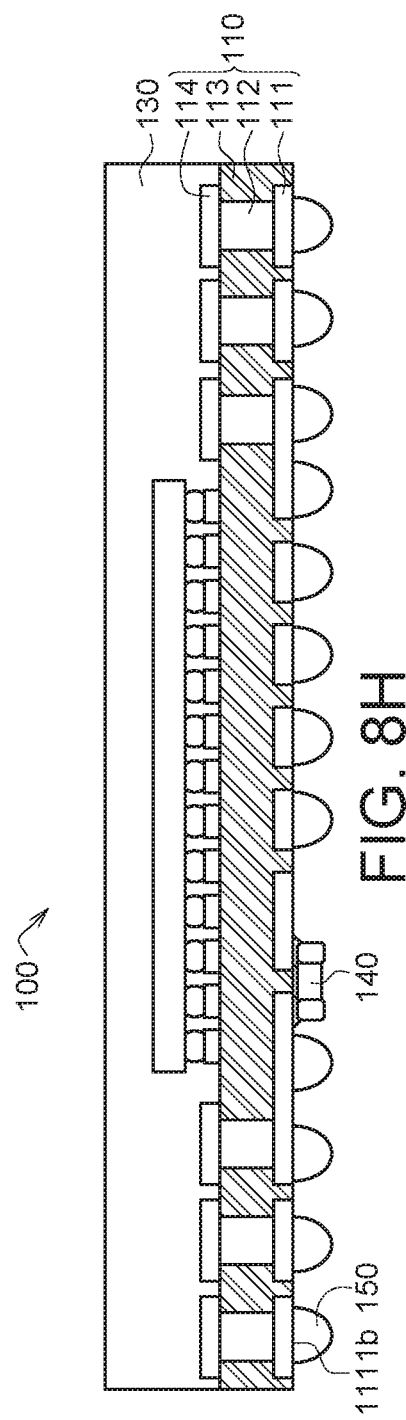

Referring to FIG. 8H, the conductive contacts 150 are formed on the first lower surface 1111b of the first conductive layer 111 using, for example, ball mounting technology. In addition, the second electronic component 140 is disposed on the first lower surface 1111b of the first conductive layer 111 using, for example, SMT.

Figure 9A:
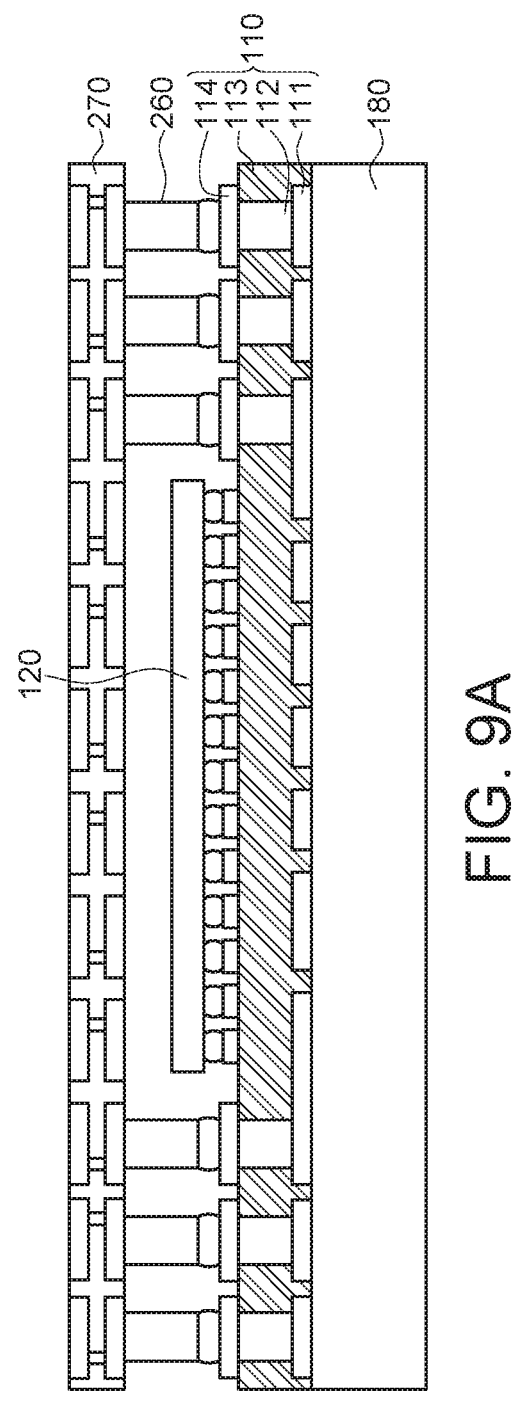
FIGS. 9A to 9B illustrate manufacturing processes of the semiconductor package of FIG. 2.
Figure 9B:
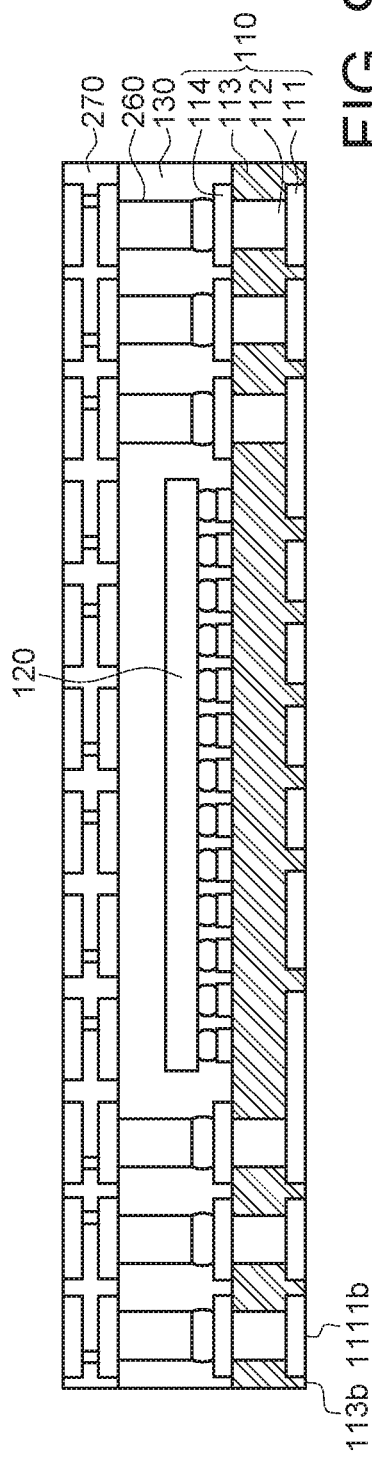

FIGS. 9A to 9B illustrate manufacturing processes of the semiconductor package 200 of FIG. 2.

Referring to FIG. 9A, the interposer 270 connects to the package substrate 110 through the second pillar layer 260. The interposer 270 may electrically connect to the first electronic component 120 through the second pillar layer 260 and the package substrate 110.

Referring to FIG. 9B, the second package body 130 encapsulating the first electronic component 120, the second conductive layer 114 and second pillar layer 260 is formed between the package substrate 110 and the interposer 270. The second package body 130 may be formed by various packaging technologies, such as, for example, compression molding, injection molding, transfer molding or dispensing technology.

Then, referring to FIG. 9B, the carrier 180 is removed. After the carrier 180 is removed, the first lower surface 1111b of the first conductive layer 111 and the second lower surface 113b of the first package body 113 are exposed, wherein the first lower surface 1111b and the second lower surface 113b are aligned with each other. For example, the first lower surface 1111b and the second lower surface 113b are coplanar.

Then, the conductive contacts 150 and the second electronic component 140 are formed on the first lower surface 1111b of the first conductive layer 111 to form the semiconductor package 200 of FIG. 2.

In another embodiment, the third electronic component 11 of FIG. 6 may be disposed on the interposer 270 of FIG. 9B to form the semiconductor device 10 of FIG. 6.

Figure 10A:
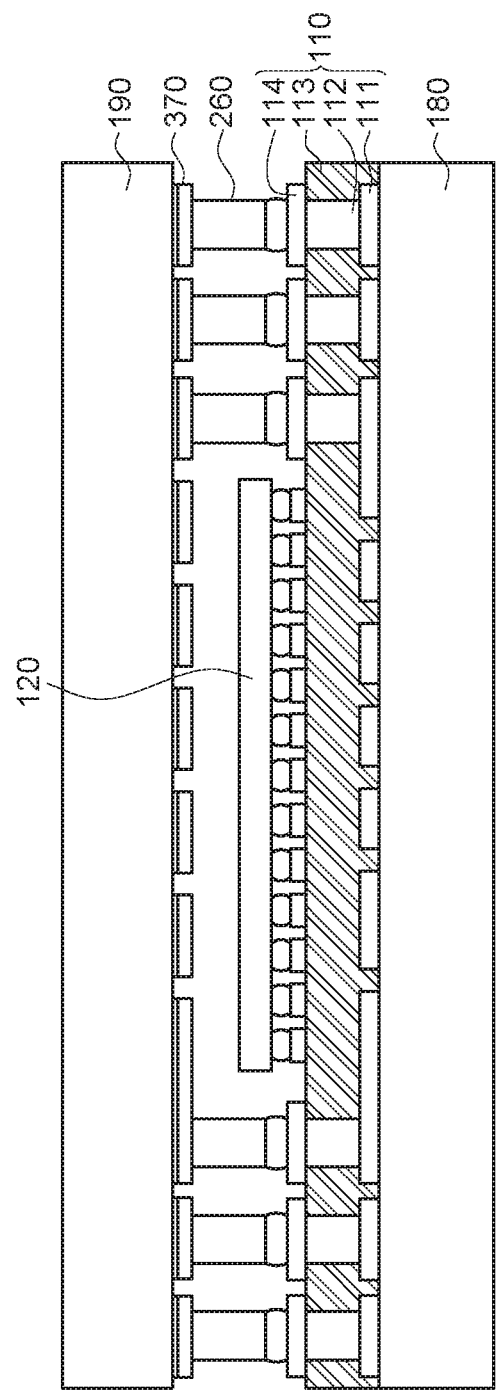
FIGS. 10A to 10C illustrate manufacturing processes of the semiconductor package of FIG. 3.
Figure 10B:
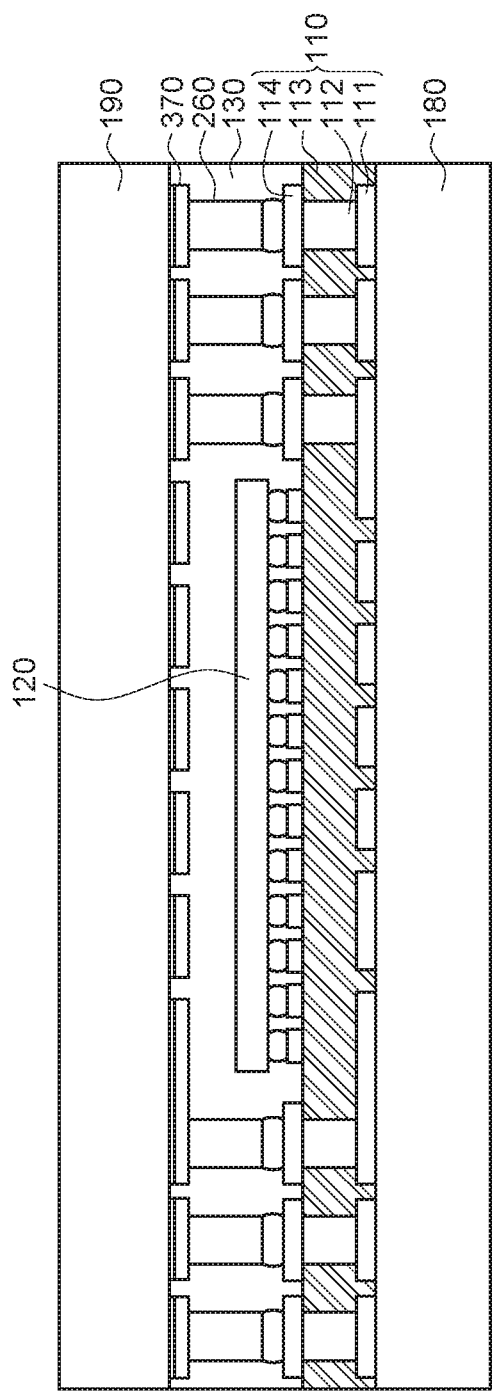
Figure 10C:
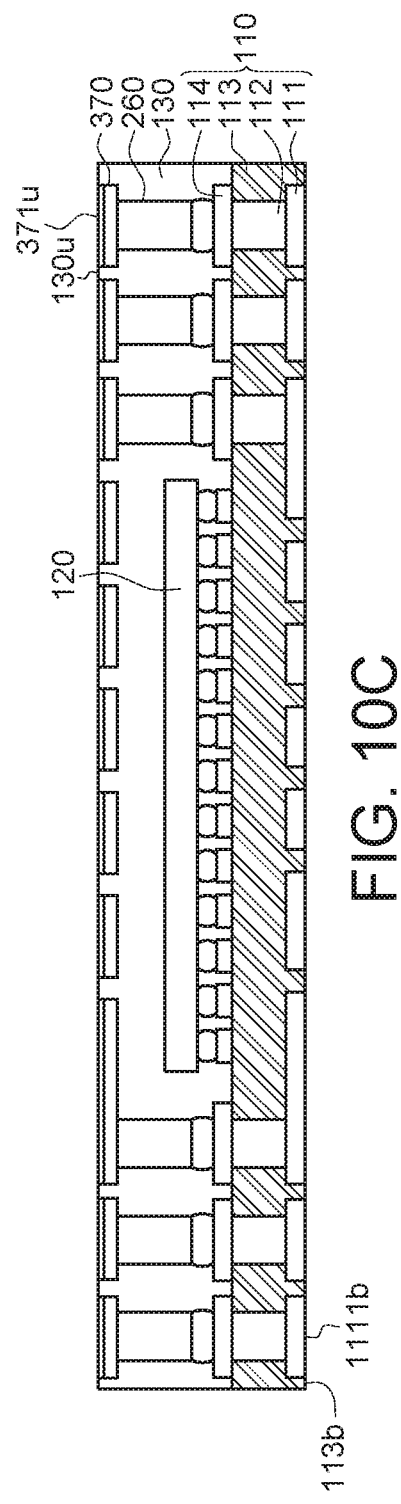

FIGS. 10A to 10C illustrate manufacturing processes of the semiconductor package 300 of FIG. 3.

Referring to FIG. 10A, the fourth conductive layer 370 formed on a carrier 190 connects to the package substrate 110 through the second pillar layer 260. The fourth conductive layer 370 may electrically connect to the first electronic component 120 through the second pillar layer 260 and the package substrate 110.

Referring to FIG. 10B, the second package body 130 encapsulating the first electronic component 120, the second conductive layer 114, the second pillar layer 260 and the fourth conductive layer 370 is formed between the package substrate 110 and the carrier 190. The second package body 130 may be formed by various packaging technologies, such as, for example, compression molding, injection molding, transfer molding or dispensing technology.

Referring to FIG. 10C, the carrier 190 is removed to expose the fourth upper surface 130u of the second package body 130 and the fifth upper surface 371u of the fourth conductive layer 370, wherein the fourth upper surface 130u and the fifth upper surface 371u are aligned with each other.

Referring to FIG. 10C, the carrier 180 is removed. After the carrier 180 is removed, the first lower surface 1111b of the first conductive layer 111 and the second lower surface 113b of the first package body 113 are exposed, wherein the first lower surface 1111b and the second lower surface 113b are aligned with each other. For example, the first lower surface 1111b and the second lower surface 113b are coplanar.

Then, the conductive contacts 150 and the second electronic component 140 are formed on the first lower surface 1111b of the first conductive layer 111 to form the semiconductor package 300 of FIG. 3.

In another embodiment, the third electronic component 11 of FIG. 7 may be disposed on the fourth conductive layer 370 of FIG. 10C to form the semiconductor device 20 of FIG. 7.

FIGS. 11A to 11H illustrate manufacturing processes of the semiconductor package 400 of FIG. 4.

Figure 11A:
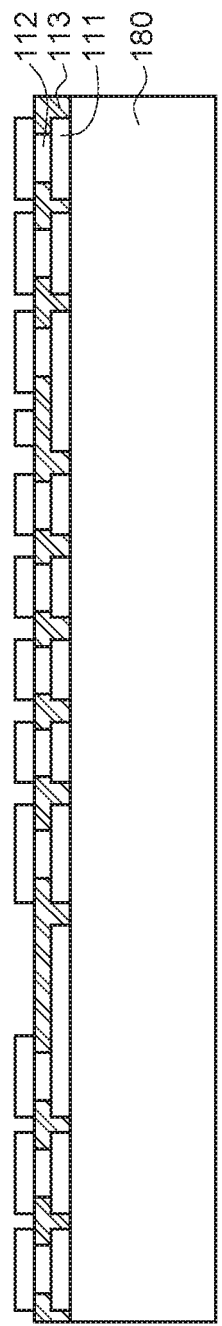
FIGS. 11A to 11H illustrate manufacturing processes of the semiconductor package of FIG. 4.

Referring to FIG. 11A, the carrier 180 is provided. The carrier 180 may be formed by a metal plate comprising of copper, iron or steel.

Referring to FIG. 11A, the first conductive layer 111, the first pillar layer 112, the first package body 113 are formed on the carrier 180 using the processes, as mentioned above.

Figure 11B:
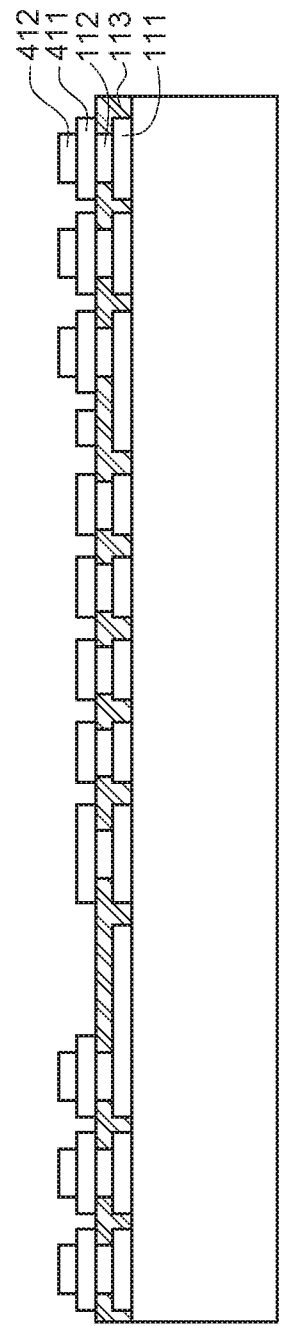

Referring to FIG. 11B, the third pillar layer 411 is formed on the first pillar layer 112 using, for example, photolithography, electroless plating, electrolytic plating, printing, sputtering, vacuum deposition, etc.

Referring to FIG. 11B, the third pillar layer 412 is formed on the third pillar layer 411 using, for example, photolithography, electroless plating, electrolytic plating, printing, sputtering, vacuum deposition, etc.

Figure 11C:
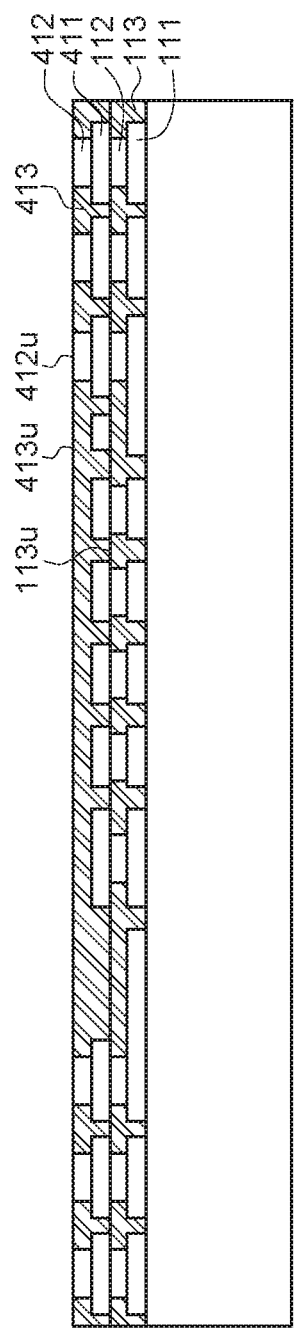

Referring to FIG. 11C, the third package body 413 encapsulating the third conductive layer 411 and the third pillar layer 412 is formed on the second upper surface 113u of the first package body 113. The third package body 413 may be formed by various packaging technologies, such as, for example, compression molding, injection molding, transfer molding or dispensing technology.

In the present embodiment, the third package body 413 may be grinded, such that an upper surface 412u of the third pillar layer 412 is exposed from the sixth upper surface 413u of the third package body 413, wherein the upper surface 412u is aligned with the sixth upper surface 413u.

Figure 11D:
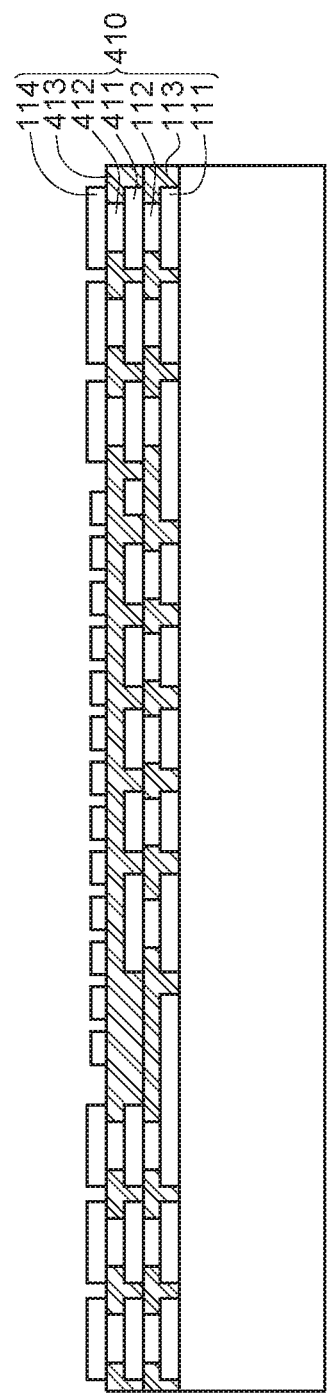

Referring to FIG. 11D, the second conductive layer 114 is formed on the third pillar layer 412 using, for example, photolithography, electroless plating, electrolytic plating, printing, sputtering, vacuum deposition, etc. The first conductive layer 111, the first pillar layer 112, the first package body 113, the second conductive layer 114, the third conductive layer 411, the third pillar layer 412 and the third package body 413 form the package substrate 410.

Figure 11E:
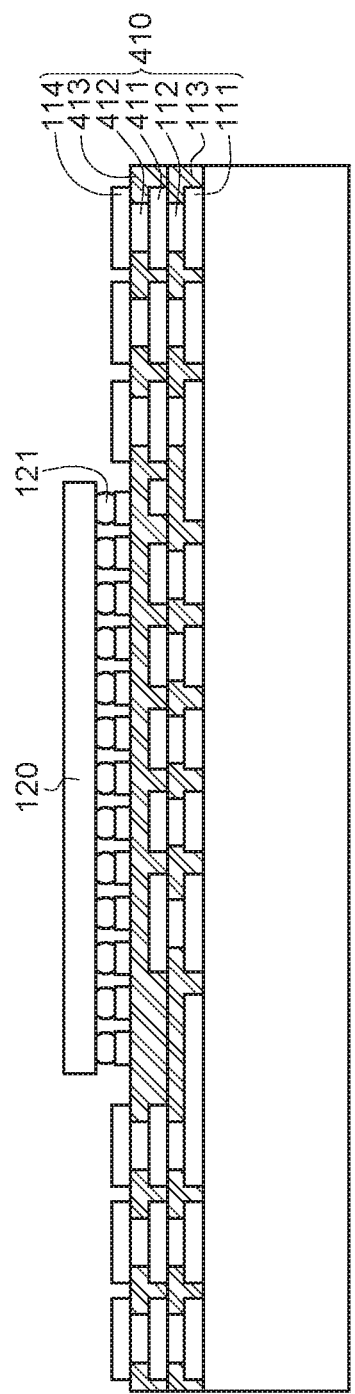

Referring to FIG. 11E, the first electronic component 120 is disposed on second conductive layer 114 of the package substrate 410 through the conductive contacts 121 using, for example, surface mount technology (SMT).

Figure 11F:
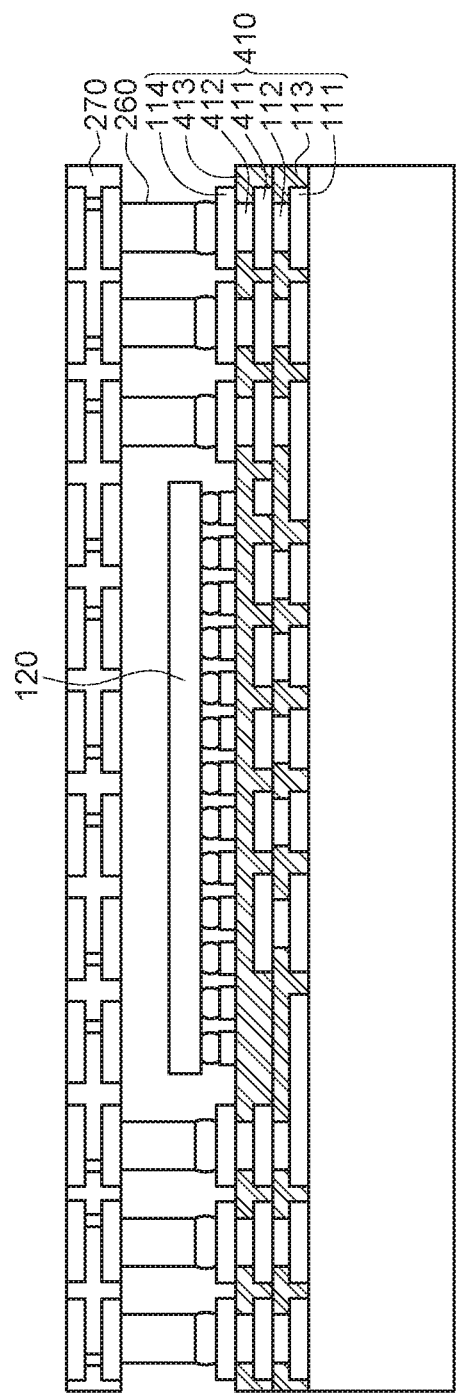

Referring to FIG. 11F, the interposer 270 connects to the package substrate 410 through the second pillar layer 260. The interposer 270 may electrically connect to the first electronic component 120 through the second pillar layer 260 and the package substrate 410.

Figure 11G:
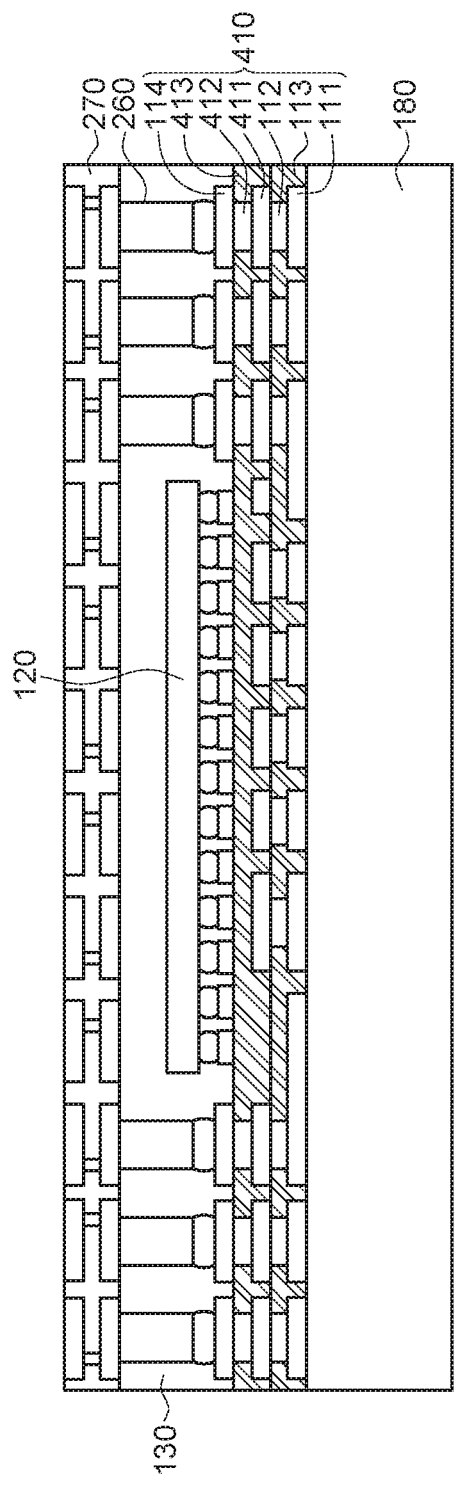

Referring to FIG. 11G, the second package body 130 encapsulating the first electronic component 120, the second conductive layer 114 and second pillar layer 260 is formed between the package substrate 410 and the interposer 270. The second package body 130 may be formed by various packaging technologies, such as, for example, compression molding, injection molding, transfer molding or dispensing technology.

Figure 11H:
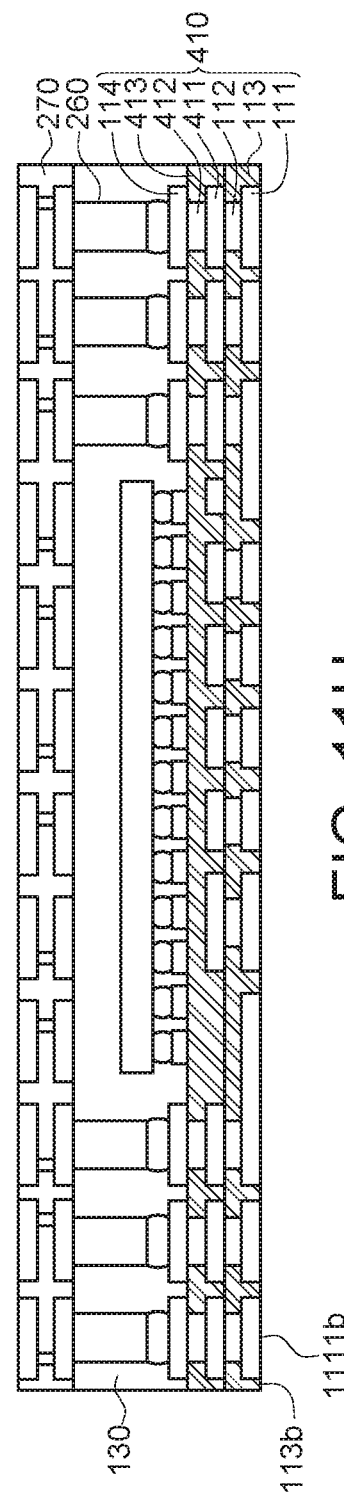

Referring to FIG. 11H, the carrier 180 is removed using, for example, etching, peeling, etc. After the carrier 180 is removed, the first lower surface 1111b of the first conductive layer 111 and the second lower surface 113b of the first package body 113 are exposed, wherein the first lower surface 1111b and the second lower surface 113b are aligned with each other. For example, the first lower surface 1111b and the second lower surface 113b are coplanar.

Then, the conductive contacts 150 and the second electronic component 140 are formed on the first lower surface 1111b of the first conductive layer 111 to form the semiconductor package 400 of FIG. 4.

In another embodiment, the third electronic component 11 of FIG. 6 may be disposed on the interposer 270 of FIG. 11H to form another semiconductor device.

Figure 12A:
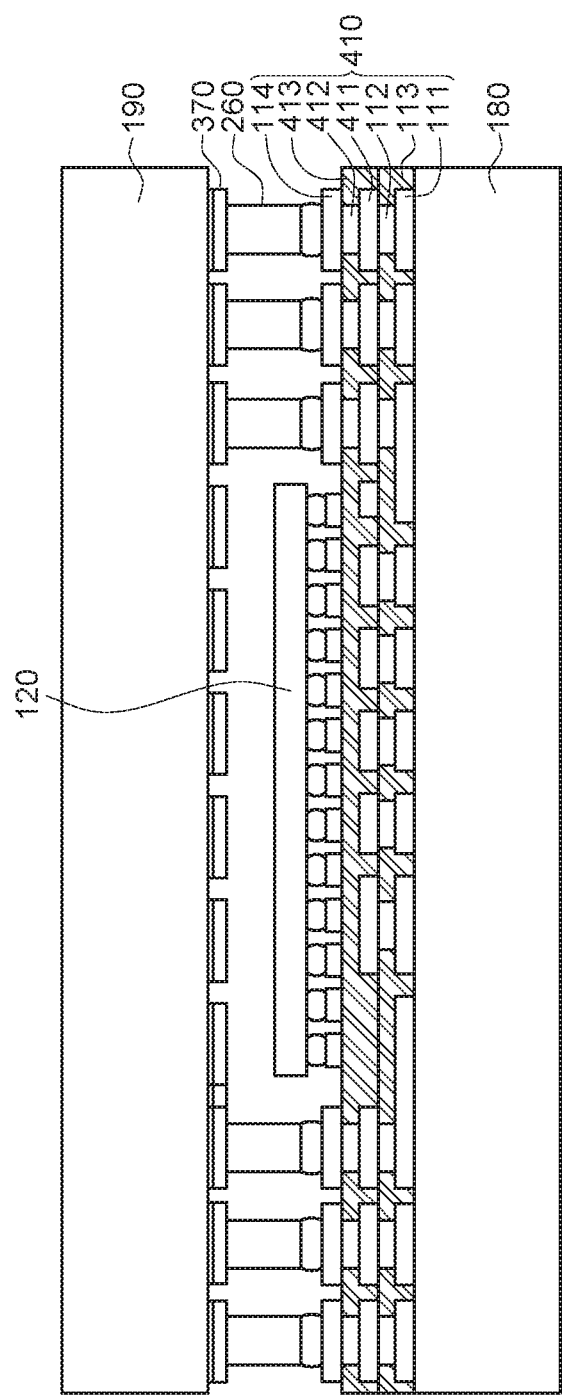
FIGS. 12A to 12C illustrate manufacturing processes of the semiconductor package of FIG. 5.
Figure 12B:
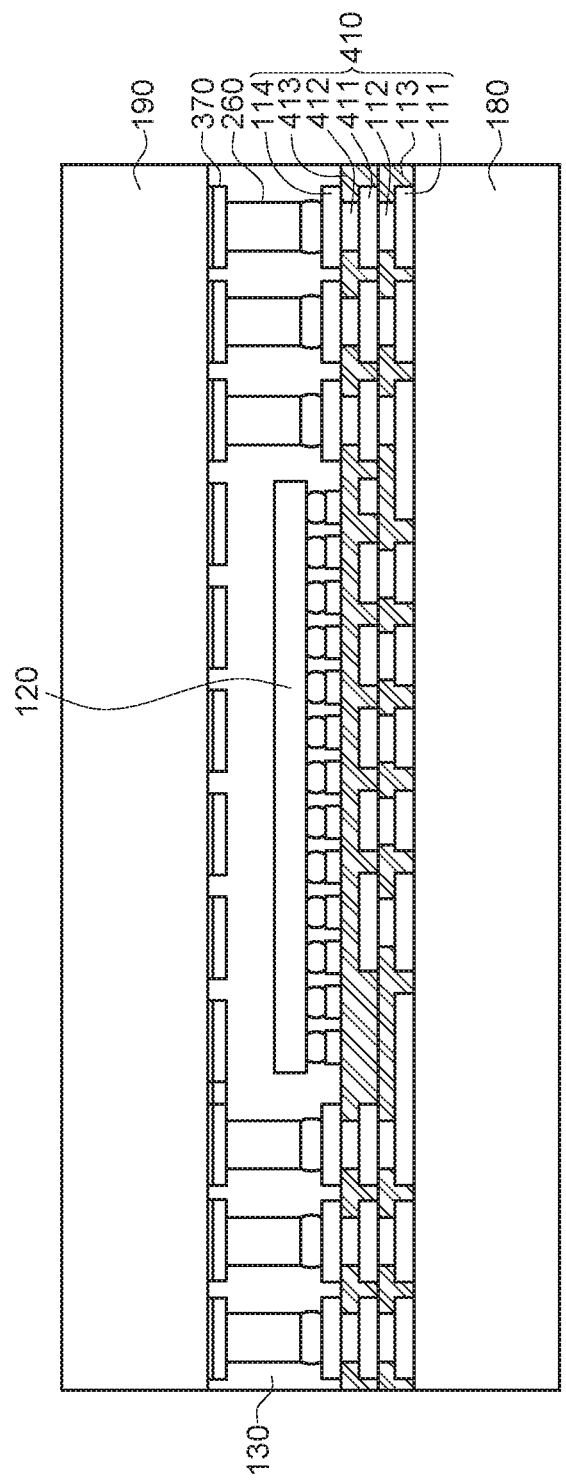
Figure 12C:
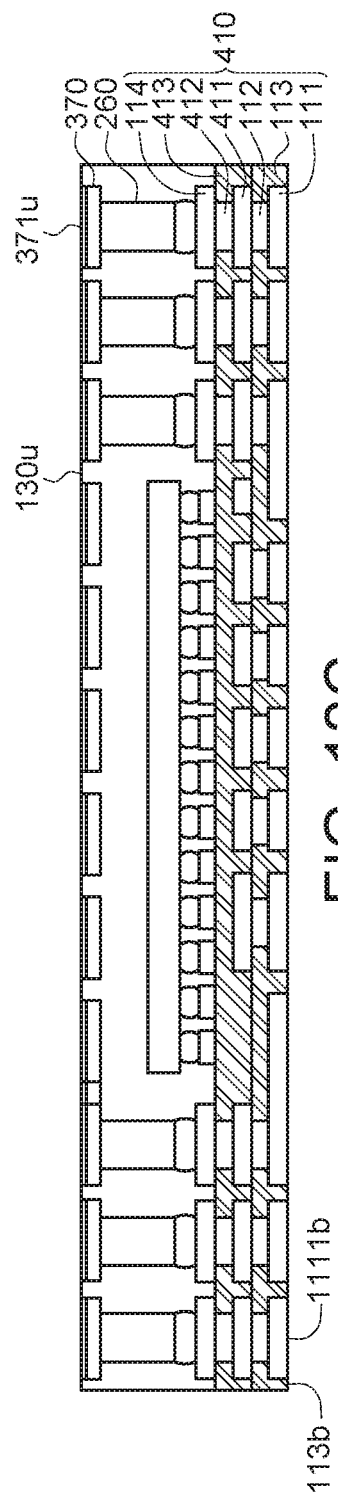

FIGS. 12A to 12C illustrate manufacturing processes of the semiconductor package 500 of FIG. 5.

Referring to FIG. 12A, the fourth conductive layer 370 formed on the carrier 190 connects to the package substrate 410 through the second pillar layer 260. The fourth conductive layer 370 may electrically connect to the first electronic component 120 through the second pillar layer 260 and the package substrate 410.

Referring to FIG. 12B, the second package body 130 encapsulating the first electronic component 120, the second conductive layer 114, the second pillar layer 260 and the fourth conductive layer 370 is formed between the package substrate 410 and the carrier 190. The second package body 130 may be formed by various packaging technologies, such as, for example, compression molding, injection molding, transfer molding or dispensing technology.

Referring to FIG. 12C, the carrier 190 is removed to expose the fourth upper surface 130u of the second package body 130 and the fifth upper surface 371u of the fourth conductive layer 370, wherein the fourth upper surface 130u and the fifth upper surface 371u are aligned with each other.

Referring to FIG. 12C, the carrier 180 is removed. After the carrier 180 is removed, the first lower surface 1111b of the first conductive layer 111 and the second lower surface 113b of the first package body 113 are exposed, wherein the first lower surface 1111b and the second lower surface 113b are aligned with each other. For example, the first lower surface 1111b and the second lower surface 113b are coplanar.

Then, the conductive contacts 150 and the second electronic component 140 are formed on the first lower surface 1111b of the first conductive layer 111 to form the semiconductor package 500 of FIG. 5.

In another embodiment, the third electronic component 11 of FIG. 7 may be disposed on the fourth conductive layer 370 of FIG. 12C to form another semiconductor device.

Figure 13:
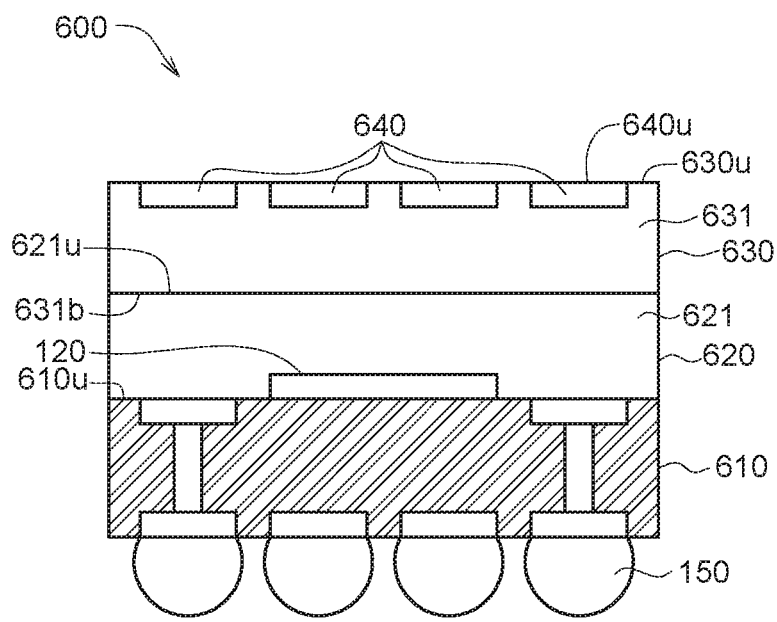
FIG. 13 illustrates a diagram of a semiconductor package according to another embodiment of the invention.

FIG. 13 illustrates a diagram of a semiconductor package 600 according to another embodiment of the invention. The semiconductor package 600 includes a first substrate 610, the first electronic component 120, a first layer structure 620, a second layer structure 630, a first antenna layer 640 and at least one conductive contact 150.

The first substrate 610 has structure the same as or similar to that of the package substrate 110, and the similarities are not repeated here. Alternatively, the first substrate 610 may be replaced by the he package substrate 110. The first electronic component 120 is disposed on a substrate upper surface 610u of the first substrate 610 and encapsulated by the first layer structure 620.

The first layer structure 620 is formed between the first substrate 610 and the second layer structure 630. The first antenna layer 640 may be formed on at least one of the first layer structure 620 and the second layer structure 630. In the present embodiment, the first antenna layer 640 is formed on the second layer structure 630.

The first antenna layer 640 is embedded in the second layer structure 630. Furthermore, the second layer structure 630 has a second layer upper surface 630u, the first antenna layer 640 has a first antenna upper surface 640u substantially flush with the second layer upper surface 630u. In another embodiment, at least one portion of the first antenna layer 640 may be projected with respect to the second layer upper surface 630u.

In the present embodiment, the first layer structure 620 includes a first package body 621, and the first package body 621 may be made of a material which is the same or similar to that of the second package body 130. In other embodiment, the first antenna layer 640 may be embedded in the first package body 621 of the second layer structure 620. For example, the first antenna upper surface 640u of the first antenna layer 640 may be flush with a first layer upper surface 621u of the first package body 621, or projected with respect to the first layer upper surface 621u.

The second layer structure 630 includes a second package body 631, and the second package body 631 may be made of a material which is the same or similar to that of the first package body 621. The first antenna layer 640 is formed on the second package body 631. In another embodiment, the second layer structure 630 may include the features similar to or the same as that of the interposer 270.

The second package body 631 has a second layer lower surface 631b, wherein the second layer lower surface 631b directly contact the first layer upper surface 621u. In the present embodiment, there is obvious interface between the second layer lower surface 631b and the first layer upper surface 621u.

In an embodiment of manufacturing method of the semiconductor package 600, the first substrate 610 may be formed firstly, then the first electronic component 120 is disposed on the first substrate 610, then the first layer structure 620 encapsulating the first electronic component 120 is formed, and then the second layer structure 630 and the first antenna layer 640 embedded in the second layer structure 630 are transferred to the first layer structure 620 through a carrier (not illustrated). In addition, the first substrate 610 and the first electronic component 120 may formed by the steps similar to or the same as that of FIGS. 8A to 8G or that of FIGS. 8A to 8H.

Figure 14:
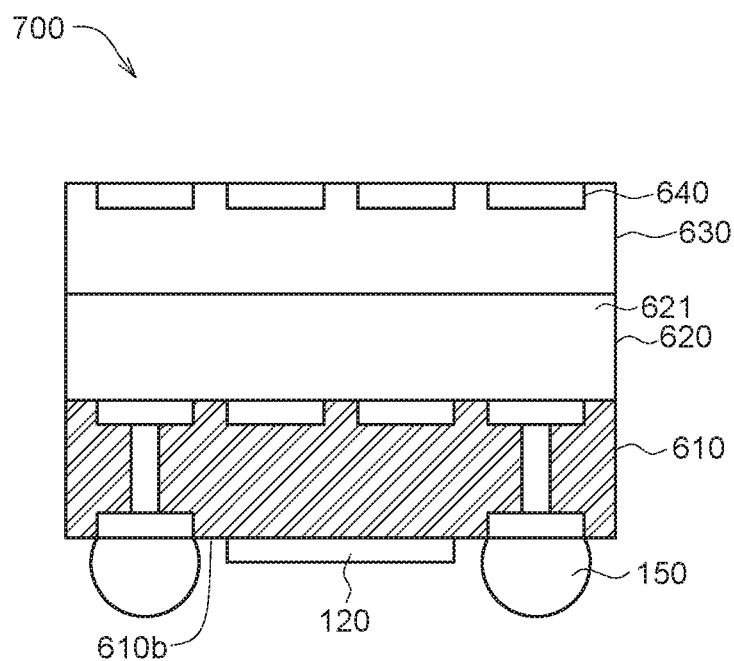
FIG. 14 illustrates a diagram of a semiconductor package according to another embodiment of the invention.

FIG. 14 illustrates a diagram of a semiconductor package 700 according to another embodiment of the invention. The semiconductor package 700 includes the first substrate 610, the first electronic component 120, the first layer structure 620, the second layer structure 630, the first antenna layer 640 and at least one conductive contact 150.

In the present embodiment, the first electronic component 120 is disposed on a substrate lower surface 610b of the first substrate 610 and exposed from the first substrate 610. In another embodiment, another first electronic component 120 may be disposed on the substrate upper surface 610u of the first substrate 610 and encapsulated by the first package body 621.

In an embodiment of manufacturing method of the semiconductor package 700, the first substrate 610 may be formed firstly, then the first electronic component 120 is disposed on the first substrate 610, then the first layer structure 620 covering the first substrate 610 is formed, then the second layer structure 630 and the first antenna layer 640 embedded in the second layer structure 630 are transferred to the first layer structure 620 through a carrier (not illustrated), and then the first electronic component 120 is disposed on the substrate lower surface 610b.

Figure 15:
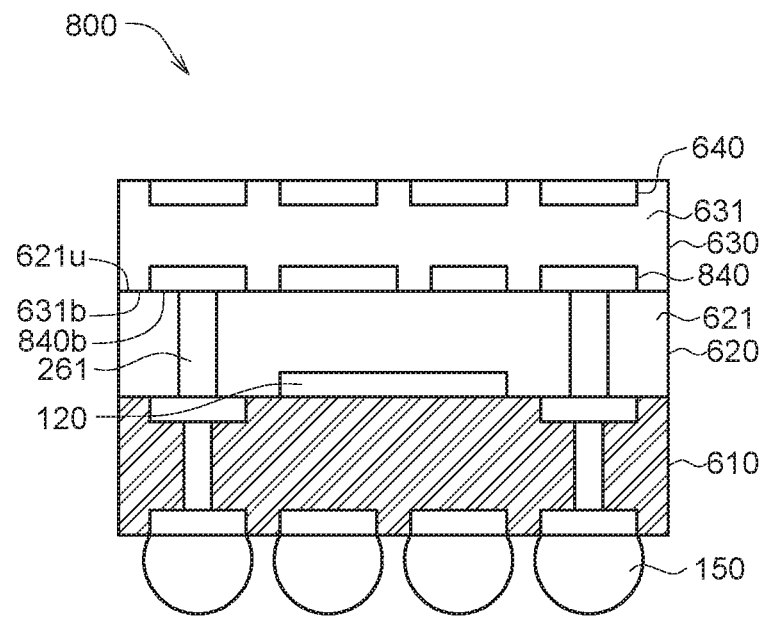
FIG. 15 illustrates a diagram of a semiconductor package according to another embodiment of the invention.

FIG. 15 illustrates a diagram of a semiconductor package 800 according to another embodiment of the invention. The semiconductor package 800 includes the first substrate 610, the first electronic component 120, the first layer structure 620, the second layer structure 630, the first antenna layer 640, at least one conductive contact 150 and a second antenna layer 840.

The second antenna layer 840 is formed on the between the first layer structure 620 and the second layer structure 630. In the present embodiment, the second antenna layer 840 is embedded in the second layer structure 630. For example, the second layer structure 630 has the second layer lower surface 631b, and the second antenna layer 840 has a second antenna lower surface 840b, wherein the second layer upper surface 631b and the second antenna lower surface 840b are flush with each other. As illustrated in FIG. 15, the second layer lower surface 631b is also flush with the first layer upper surface 621u of the first layer structure 620. In another embodiment, at least one portion of the second antenna lower surface 840b may be embedded in the first layer structure 620.

As illustrated in FIG. 15, the semiconductor package 800 further includes at least one pillar 261. The pillars 261 are embedded in the first package body 621 and electrically connect the second antenna layer 840 with the first substrate 610. In another embodiment, at least one pillar 261 may be embedded in the second package body 631 to electrically connect the first antenna layer 640 and the second antenna layer 840.

In an embodiment of manufacturing method of the semiconductor package 800, the first substrate 610 may be formed firstly, then the first electronic component 120 is disposed on the first substrate 610, then the first layer structure 620 encapsulating the first electronic component 120 is formed, and then the pillars 261 are formed on the first layer structure 620, then the second layer structure 630, the first antenna layer 640 embedded in the second layer structure 630 and the second antenna layer 840 embedded in the second layer structure 630 are transferred to the first layer structure 620 through a carrier (not illustrated). In addition, the pillars 261 and the first package body 621 may formed by the steps similar to or the same as that of FIGS. 10A to 10C or that of FIGS. 12A to 12C.

Figure 16:
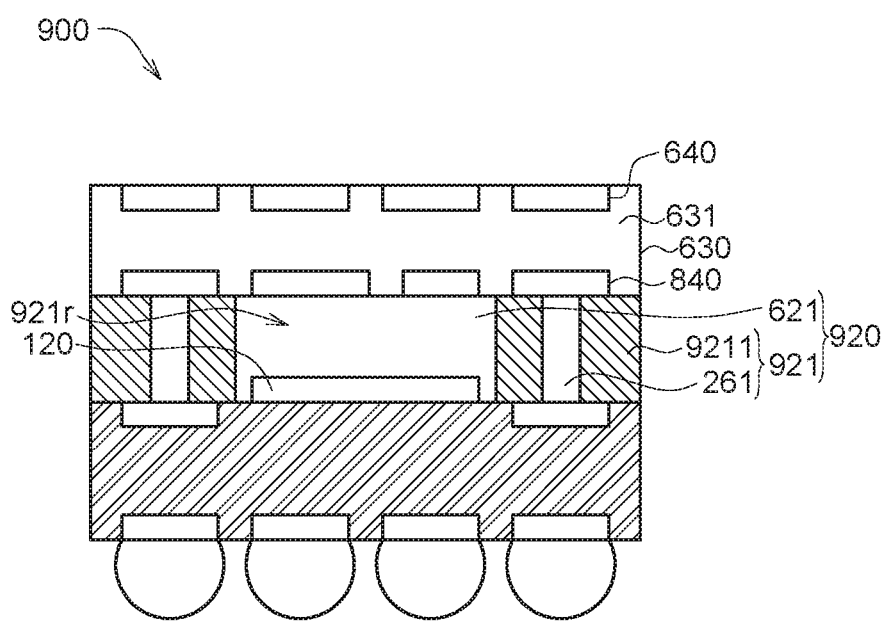
FIG. 16 illustrates a diagram of a semiconductor package according to another embodiment of the invention.

FIG. 16 illustrates a diagram of a semiconductor package 900 according to another embodiment of the invention. The semiconductor package 900 includes the first substrate 610, the first electronic component 120, the first layer structure 920, the second layer structure 630, the first antenna layer 640, at least one conductive contact 150 and the second antenna layer 840.

The first layer structure 920 includes a second substrate 921 and the first package body 621. The second substrate 921 has a receiving portion 921r, and the first package body 621 fills up the receiving portion 921r and encapsulates the first electronic component 120 disposed within the receiving portion 921r.

The second substrate 921 includes at least one pillar 261 and a substrate material 9211, wherein the pillars 261 pass through the substrate material 9211 for being electrically connecting the second antenna layer 840 with first substrate 610.

In addition, the substrate material 9211 may include multiple sub-dielectric layers. To simplify the diagram, only a single dielectric layer is depicted herein as an example. In some embodiments, the substrate may be formed of organic materials, which include a polymer base material, non-organic materials, which include silicon nitride (SiNX), silicon oxide (SiOX), graphene, or the like. In some embodiments, the substrate is a high-k dielectric layer (k is the dielectric constant of the dielectric layer). In some other embodiments, the substrate may be formed of a photosensitive material, which includes a dry film photoresist, or a taping film.

In the present embodiment, the entire second antenna layer 840 is embedded in the second layer structure 630. In another embodiment, the entire second antenna layer 840 may be embedded in the first layer structure 920. For example, a portion of the second antenna layer 840 is embedded in the first package body 621, and the other of the second antenna layer 840 is embedded in the second substrate 921.

In an embodiment of the manufacturing method of the semiconductor package 900, the first substrate 610 may be formed firstly, then the first electronic component 120 is disposed on the first substrate 610, then the second substrate 921 is disposed on the first substrate 610, then the first package body 621 filling up the receiving portion 921r and encapsulating the first electronic component 120 is formed, and then the second layer structure 630, the first antenna layer 640 embedded in the second layer structure 630 and the second antenna layer 840 embedded in the second layer structure 630 are transferred to the first layer structure 620 through a carrier (not illustrated).

Figure 17:
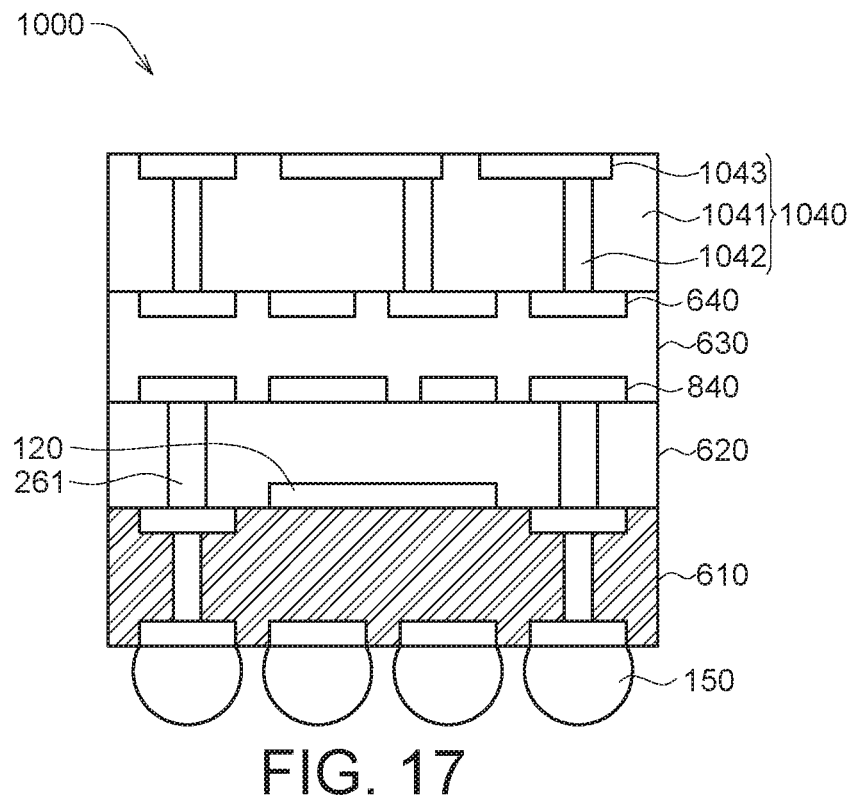
FIG. 17 illustrates a diagram of a semiconductor package according to another embodiment of the invention.

FIG. 17 illustrates a diagram of a semiconductor package 1000 according to another embodiment of the invention. The semiconductor package 1000 includes at least one pillar 261, the first substrate 610, the first electronic component 120, the first layer structure 620, the second layer structure 630, the first antenna layer 640, at least one conductive contact 150, the second antenna layer 840 and at least one third layer structure 1040.

The third layer structure 1040 is stacked on the second layer structure 630. The third layer structure 1040 includes a package body 1041, at least one pillar 1042 and a third antenna layer 1043. The third antenna layer 1043 is formed on the package body 1041, the pillars 1042 are embedded in the package body 1041 to electrically connect the third antenna layer 1043 with the first antenna layer 640 embedded in the second layer structure 630. In addition, the package body 1041 may be made of a material which is the same or similar to that of the second package body 130. In another embodiment, the third layer structure 1040 has the structures similar or the same as that of the first layer structure 620, or replaced by the first layer structure 620.

In another embodiment, the first layer structure 620 of the semiconductor package 1000 may be replaced by the first layer structure 920.

Figure 18:
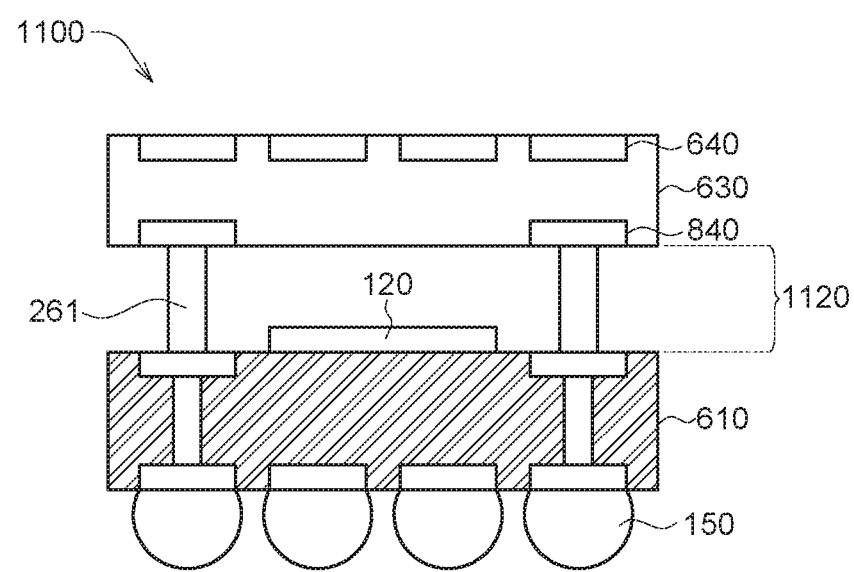
FIG. 18 illustrates a diagram of a semiconductor package according to another embodiment of the invention.

FIG. 18 illustrates a diagram of a semiconductor package 1100 according to another embodiment of the invention. The semiconductor package 1100 includes the first substrate 610, the first electronic component 120, a first layer structure 1120, the second layer structure 630, the first antenna layer 640, at least one conductive contact 150 and the second antenna layer 840.

In the present embodiment, the first layer structure 1120 includes a conductive pillar layer including at least one pillar 261 exposed from the first layer structure 1120, that is, the conductive pillar layer is not encapsulated by any physical material. In addition, the first electronic component 120 disposed on the first substrate 610, surrounded by the conductive pillar layer and is also exposed from the first layer structure 1120. Due to the pillars 261 being exposed (not encapsulated) from the first layer structure 1120, the heat dissipation of the overall semiconductor package can be effectively improved.

In an embodiment of the manufacturing method of the semiconductor package 1100, the first substrate 610 may be formed firstly, then the first electronic component 120 is disposed on the first substrate 610, then the pillars 261 are formed on the first substrate 610 by using way similar to that of FIG. 12A, then the second layer structure 630, the first antenna layer 640 embedded in the second layer structure 630 and the second antenna layer 840 embedded in the second layer structure 630 are transferred to the pillars 261 through a carrier (not illustrated).

Figure 19:
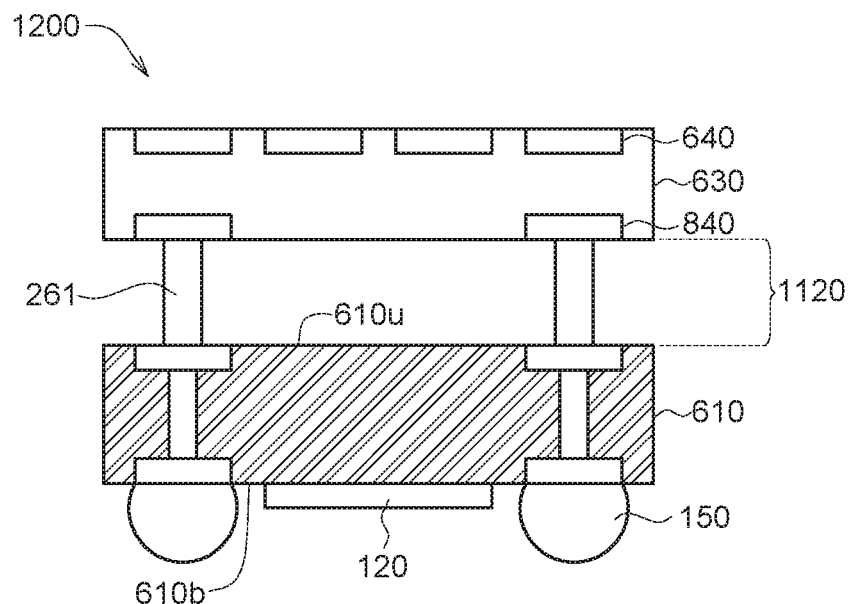
FIG. 19 illustrates a diagram of a semiconductor package according to another embodiment of the invention.

FIG. 19 illustrates a diagram of a semiconductor package 1200 according to another embodiment of the invention. The semiconductor package 1200 includes the first substrate 610, the first electronic component 120, the first layer structure 1120, the second layer structure 630, the first antenna layer 640, at least one conductive contact 150 and the second antenna layer 840.

In the present embodiment, the first electronic component 120 is disposed on the substrate lower surface 610*b* of the first substrate 610 and exposed from the first substrate 610. In another embodiment, another first electronic component 120 may be disposed on the substrate upper surface 610*u* of the first substrate 610 and exposed from the first layer structure 1120.

In an embodiment of the manufacturing method of the semiconductor package 1100, the first substrate 610 may be formed firstly, then the pillars 261 are formed on the first substrate 610 by using way similar to that of FIG. 12A, then the second layer structure 630, the first antenna layer 640 embedded in the second layer structure 630 and the second antenna layer 840 embedded in the second layer structure 630 are transferred to the pillars 261 through a carrier (not illustrated), and then the first electronic component 120 is disposed on the substrate lower surface 610*b* of the first substrate 610.

Figure 20:
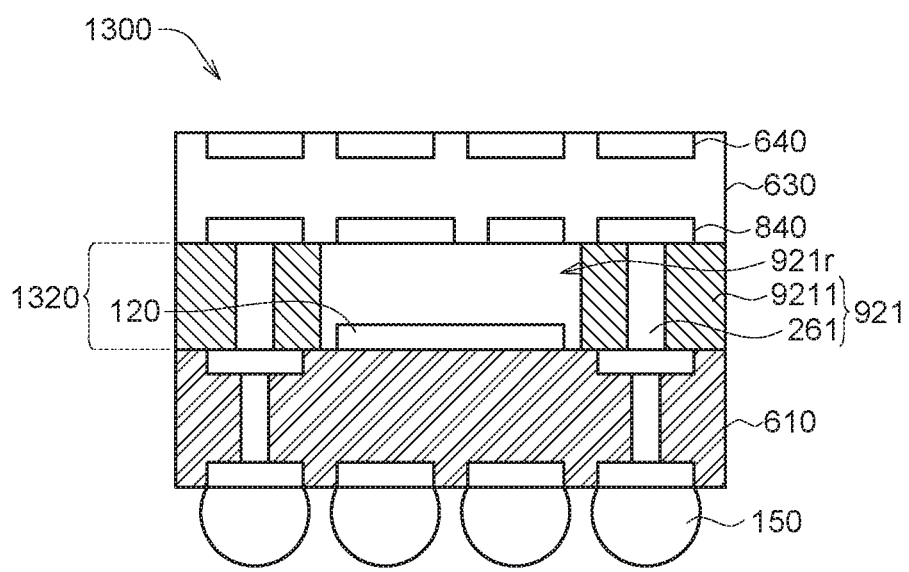
FIG. 20 illustrates a diagram of a semiconductor package according to another embodiment of the invention.

FIG. 20 illustrates a diagram of a semiconductor package 1200 according to another embodiment of the invention. The semiconductor package 1300 includes the first substrate 610, the first electronic component 120, a first layer structure 1320, the second layer structure 630, the first antenna layer 640, at least one conductive contact 150 and the second antenna layer 840.

In the present embodiment, the first layer structure 1320 includes the second substrate 921. The second substrate 921 includes at least one pillar 261 and a substrate material 9211, wherein the pillars 261 pass through the substrate material 9211 for being electrically connecting the second antenna layer 840 with first substrate 610. The second substrate 921 has the receiving portion 921*r*, and there in no physical material filled up the receiving portion 921*r*. The first electronic component 120 is disposed within the receiving portion 921*r* and exposed from the receiving portion 921*r*.

In an embodiment of the manufacturing method of the semiconductor package 1300, the first substrate 610 may be formed firstly, then the first electronic component 120 is disposed on the first substrate 610, then the second substrate 921 is disposed on the first substrate 610, and then the second layer structure 630, the first antenna layer 640 embedded in the second layer structure 630 and the second antenna layer 840 embedded in the second layer structure 630 are transferred to the second substrate 921 through a carrier (not illustrated).

Figure 21:
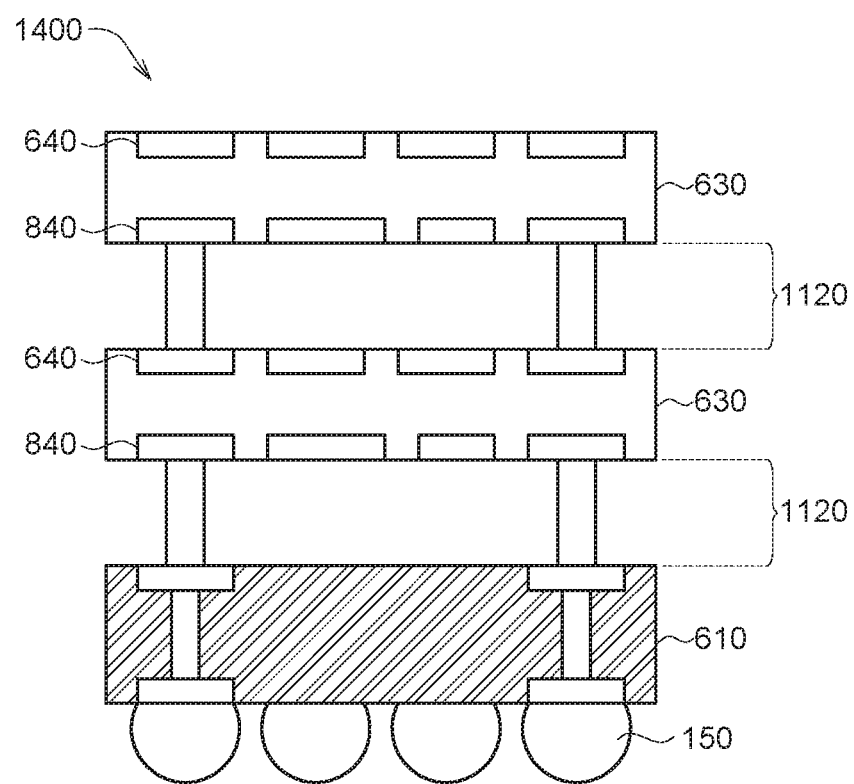
FIG. 21 illustrates a diagram of a semiconductor package according to another embodiment of the invention.

FIG. 21 illustrates a diagram of a semiconductor package 1400 according to another embodiment of the invention. The semiconductor package 1400 includes the first substrate 610, the first electronic component 120, a plurality of the first layer structures 1120, a plurality of the second layer structures 630, a plurality of the first antenna layers 640, at least one conductive contact 150 and a plurality of the second antenna layers 840.

In the present embodiment, one of the first layer structures 1120 is stacked to the first substrate 610, one of the second layer structures 630 is stacked to the first layer structures 1120, another of the first layer structures 1120 is stacked to the second layer structures 630, and another of the second layer structures 630 is stacked to the first layer structures 1120

Figure 22:
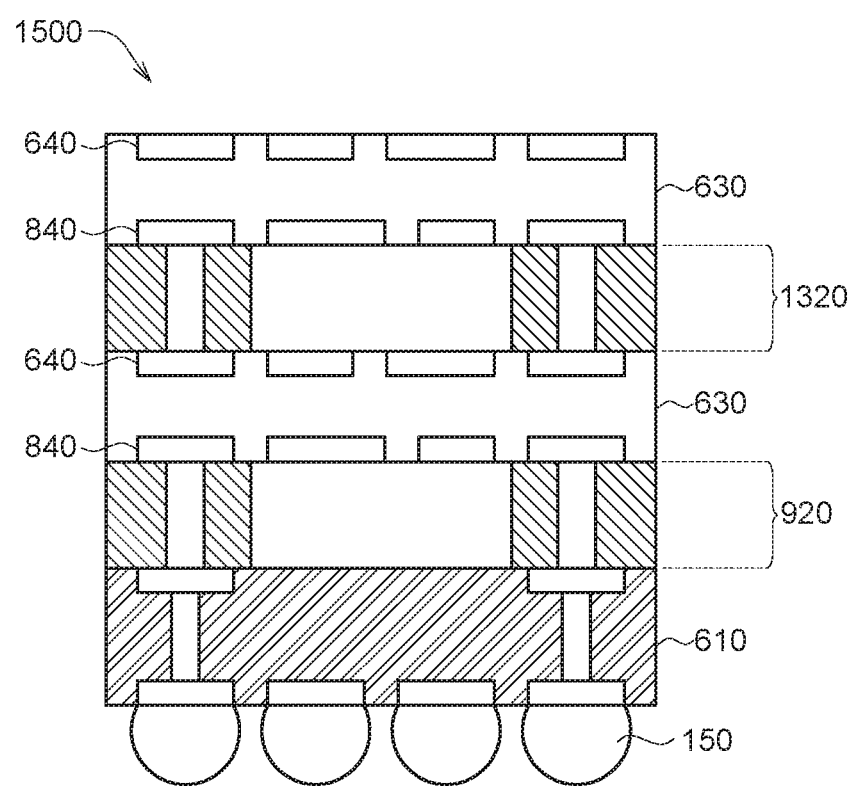
FIG. 22 illustrates a diagram of a semiconductor package according to another embodiment of the invention.

FIG. 22 illustrates a diagram of a semiconductor package 1500 according to another embodiment of the invention. The semiconductor package 1500 includes the first substrate 610, the first electronic component 120, the first layer structures 920 and 1320, a plurality of the second layer structures 630, a plurality of the first antenna layers 640, at least one conductive contact 150 and a plurality of the second antenna layers 840.

In the present embodiment, the first layer structure 920 is stacked to the first substrate 610, one of the second layer structures 630 is stacked to the first layer structures 920, the first layer structures 1320 is stacked to the second layer structures 630, and another of the second layer structures 630 is stacked to the first layer structures 1320.

As described above, the number of the first layer structures may be plural, and the number of the second layer structures may be plural, wherein one of the first layer structures may be disposed between the first substrate and one of the second layer structures, and another of the first layer structures may be disposed between the two of the second layer structures.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor package, comprises:
   a first substrate;
   a first layer structure;
   a second layer structure;
   a first antenna layer formed on at least one of the first layer structure and the second layer structure;
   wherein the first layer structure is formed between the first substrate and the second layer structure;
   wherein the first antenna layer has an upper surface flush with a layer upper surface of the second layer structure;
   wherein no physical conductive element is disposed between the first antenna layer and the first substrate, and the second layer structure is molding compound.

2. The semiconductor package as claimed in claim 1, further comprises:

a second antenna layer formed on at least one of the first layer structure and the second layer structure.

3. The semiconductor package as claimed in claim 2, wherein the second layer structure has a layer lower surface, the second antenna layer has an antenna lower surface substantially flush with the layer lower surface.

4. The semiconductor package as claimed in claim 1, wherein the first layer structure comprises a first package body having a layer upper surface, the second layer structure comprises a second package body having a layer lower surface directly contact the layer upper surface.

5. The semiconductor package as claimed in claim 1, further comprises:
    an electronic component disposed on a substrate upper surface of the first substrate and encapsulated by the first layer structure.

6. The semiconductor package as claimed in claim 1, further comprises:
    an electronic component disposed on a substrate lower surface of the first substrate and exposed from the first substrate.

7. The semiconductor package as claimed in claim 1, wherein the second layer structure comprises a package body, the first antenna layer is embedded in the package body.

8. The semiconductor package as claimed in claim 1, wherein the first layer structure comprises a second substrate and a first package body, the second substrate has a receiving portion, and the first package body fills up the receiving portion.

9. The semiconductor package as claimed in claim 8, further comprises:
    an electronic component disposed within the receiving portion and encapsulated by the first package body.

10. The semiconductor package as claimed in claim 8, further comprises:
    an electronic component disposed within the receiving portion and exposed from the first layer structure.

11. A semiconductor package, comprises:
    a first substrate;
    a first layer structure comprising a conductive pillar layer, wherein the conductive pillar layer comprises a pillar having a lateral surface which is not encapsulated by any physical material;
    a second layer structure;
    a first antenna layer formed on at least one of the first layer structure and the second layer structure;
    wherein the first layer structure is formed between the first substrate and the second layer structure;
    wherein the conductive pillar layer electrically connects the second layer structure with the first substrate.

12. The semiconductor package as claimed in claim 11, wherein the second layer structure has a layer upper surface, the first antenna layer has an antenna upper surface substantially flush with the layer upper surface.

13. The semiconductor package as claimed in claim 11, further comprises:
    a second antenna layer formed on at least one of the second layer structure.

14. The semiconductor package as claimed in claim 13, wherein the second layer structure has a layer lower surface, the second antenna layer has an antenna lower surface substantially flush with the layer lower surface.

15. The semiconductor package as claimed in claim 11, further comprises:
    an electronic component disposed on a substrate upper surface of the first substrate and surrounded by the conductive pillar layer.

16. The semiconductor package as claimed in claim 11, further comprises:
    an electronic component disposed on a substrate lower surface of the first substrate and exposed from the first substrate.

17. The semiconductor package as claimed in claim 16, wherein the second layer structure comprises a package body, the first antenna layer is embedded in the package body.

* * * * *